US009530620B2

(12) United States Patent
Valcore, Jr.

(10) Patent No.: US 9,530,620 B2
(45) Date of Patent: Dec. 27, 2016

(54) DUAL CONTROL MODES

(71) Applicant: Lam Research Corporation, Fremont, CA (US)

(72) Inventor: John C. Valcore, Jr., Berkeley, CA (US)

(73) Assignee: Lam Research Corporation, Fremont, CA (US)

( * ) Notice: Subject to any disclaimer, the term of this patent is extended or adjusted under 35 U.S.C. 154(b) by 280 days.

(21) Appl. No.: 14/184,654

(22) Filed: Feb. 19, 2014

(65) Prior Publication Data

US 2014/0265852 A1    Sep. 18, 2014

Related U.S. Application Data

(63) Continuation-in-part of application No. 14/184,639, filed on Feb. 19, 2014.

(60) Provisional application No. 61/799,594, filed on Mar. 15, 2013, provisional application No. 61/799,969, filed on Mar. 15, 2013.

(51) Int. Cl.
*H01J 37/32* (2006.01)

(52) U.S. Cl.
CPC ...... *H01J 37/32183* (2013.01); *H01J 37/3299* (2013.01); *H01J 37/32935* (2013.01)

(58) Field of Classification Search
None
See application file for complete search history.

(56) References Cited

U.S. PATENT DOCUMENTS

| 4,454,001 A | 6/1984 | Sternheim et al. |
| 4,500,563 A | 2/1985 | Ellenberger et al. |
| 5,694,207 A | 12/1997 | Hung et al. |
| 5,788,801 A | 8/1998 | Barbee et al. |

(Continued)

FOREIGN PATENT DOCUMENTS

JP    2005130198    5/2005

OTHER PUBLICATIONS

Thorsten, Lill et al, "Controlling ION Energy Within a Plasma Chamber", U.S. Appl. No. 13/930,138, filed Jun. 28, 2013.

(Continued)

*Primary Examiner* — Douglas W Owens
*Assistant Examiner* — Srinivas Sathiraju
(74) *Attorney, Agent, or Firm* — Martine Penilla Group, LLP

(57) ABSTRACT

Systems and methods for using variables based on a state associated with a plasma system. A method includes determining whether the state associated with the plasma system is a first state or a second state and determining a first variable upon determining that the state is the first state. The first variable is determined based on a measurement at a communication medium. The method further includes determining a second variable upon determining that the state is the second state. The second variable is determined based on a measurement at the communication medium. The method includes determining whether the second variable exceeds a first threshold, providing an instruction to reduce power supplied to a plasma chamber upon determining that the second variable exceeds the first threshold, and providing an instruction to increase power supplied to the plasma chamber upon determining that the second variable is below the first threshold.

20 Claims, 14 Drawing Sheets

(56) References Cited

U.S. PATENT DOCUMENTS

| | | | |
|---|---|---|---|
| 5,889,252 A | 3/1999 | Williams et al. | |
| 5,892,198 A | 4/1999 | Barnes et al. | |
| 6,020,794 A | 2/2000 | Wilbur | |
| 6,021,672 A | 2/2000 | Lee | |
| 6,042,686 A | 3/2000 | Dible et al. | |
| 6,048,435 A | 4/2000 | DeOrnellas et al. | |
| 6,110,214 A | 8/2000 | Klimasauskas | |
| 6,246,972 B1 | 6/2001 | Klimasauskas | |
| 6,472,822 B1 | 10/2002 | Chen et al. | |
| 6,669,783 B2 | 12/2003 | Sexton et al. | |
| 6,750,711 B2 | 6/2004 | Chawla et al. | |
| 6,823,815 B2 | 11/2004 | Han et al. | |
| 6,830,650 B2* | 12/2004 | Roche | H01J 37/32935 118/712 |
| 6,838,635 B2 | 1/2005 | Hoffman et al. | |
| 6,862,557 B2 | 3/2005 | Jones et al. | |
| 6,873,114 B2* | 3/2005 | Avoyan | H01J 37/32935 118/50.1 |
| 6,972,524 B1 | 12/2005 | Marakhtanov et al. | |
| 6,983,215 B2 | 1/2006 | Coumou et al. | |
| 7,122,965 B2 | 10/2006 | Goodman | |
| 7,192,505 B2* | 3/2007 | Roche | H01J 37/32935 118/712 |
| 7,323,116 B2 | 1/2008 | Guiney et al. | |
| 7,435,926 B2 | 10/2008 | Jafarian-Tehrani | |
| 7,459,100 B2 | 12/2008 | Kiemasz et al. | |
| 7,728,602 B2 | 6/2010 | Valcore et al. | |
| 7,858,898 B2 | 12/2010 | Bailey, III et al. | |
| 8,080,168 B2 | 12/2011 | Cirigliano | |
| 8,080,760 B2 | 12/2011 | Dhindsa et al. | |
| 8,264,238 B1 | 9/2012 | El-Chouelry | |
| 8,271,121 B2 | 9/2012 | Venugopal et al. | |
| 8,404,598 B2 | 3/2013 | Liao et al. | |
| 8,741,095 B2* | 6/2014 | Koshimizu | H01J 37/32165 118/723 E |
| 2004/0007326 A1* | 1/2004 | Roche | H01J 37/32935 156/345.24 |
| 2004/0060660 A1 | 4/2004 | Klimechy et al. | |
| 2004/0061448 A1 | 4/2004 | Avoyan et al. | |
| 2004/0222184 A1 | 11/2004 | Hayami et al. | |
| 2005/0011611 A1* | 1/2005 | Mahoney | H01J 37/32935 156/345.24 |
| 2005/0034812 A1* | 2/2005 | Roche | H01J 37/32935 156/345.28 |
| 2005/0039852 A1* | 2/2005 | Roche | H01J 37/32935 156/345.24 |
| 2005/0090118 A1 | 4/2005 | Shannon et al. | |
| 2005/0133163 A1 | 6/2005 | Shannon et al. | |
| 2005/0151479 A1* | 7/2005 | Avoyan | H01J 37/32935 315/111.71 |
| 2005/0217797 A1* | 10/2005 | Jafarian-Tehrani | H01J 37/32082 156/345.28 |
| 2006/0065623 A1 | 3/2006 | Guiney et al. | |
| 2006/0065631 A1* | 3/2006 | Cheng | H01J 37/32082 216/86 |
| 2006/0065632 A1 | 3/2006 | Cheng et al. | |
| 2006/0232471 A1* | 10/2006 | Coumou | H01J 37/32082 342/450 |
| 2007/0021935 A1 | 1/2007 | Larson et al. | |
| 2009/0255800 A1* | 10/2009 | Koshimizu | H01J 37/32165 204/164 |
| 2009/0294061 A1 | 12/2009 | Shannon et al. | |
| 2009/0295296 A1 | 12/2009 | Shannon et al. | |
| 2010/0099266 A1 | 4/2010 | Oswald et al. | |
| 2010/0252417 A1* | 10/2010 | Allen | C23C 14/345 204/192.12 |
| 2011/0061810 A1* | 3/2011 | Ganguly | H01L 21/0223 156/345.27 |
| 2011/0061812 A1* | 3/2011 | Ganguly | H01L 21/0223 156/345.34 |
| 2011/0115492 A1* | 5/2011 | Valcore, Jr. | G01N 27/62 324/464 |
| 2011/0118863 A1 | 5/2011 | Valcore, Jr. | |
| 2011/0137446 A1* | 6/2011 | Valcore, Jr. | H01J 37/32082 700/108 |
| 2012/0073754 A1 | 3/2012 | De la Llera et al. | |
| 2012/0318456 A1* | 12/2012 | Brouk | H01J 37/32009 156/345.28 |
| 2012/0319584 A1* | 12/2012 | Brouk | H01J 37/32009 315/111.21 |
| 2013/0213934 A1* | 8/2013 | Valcore, Jr. | H01J 37/32091 216/67 |
| 2014/0062303 A1* | 3/2014 | Hoffman | H05H 1/46 315/111.21 |
| 2014/0305589 A1* | 10/2014 | Valcore, Jr. | H01J 37/32146 156/345.24 |

OTHER PUBLICATIONS

"Electromagnetic Waves and Antennas", Sophocles J. Orfanidis, Rutgers University, Aug. 25, 2013, Chapter 10.10.

Damon et al., "Synchronous Pulsed Plasma for Silicon Etch Applications", ECS Transactions, 27 (1) pp. 717-723 (2010), Publication by: The Electrochemical Society.

* cited by examiner

DUAL CONTROL MODES

CLAIM OF PRIORITY

This application claims the benefit of and priority to, under 35 U.S.C. 119§(e), to U.S. Provisional Patent Application No. 61/799,594, filed on Mar. 15, 2013, and titled "Dual Control Modes", which is hereby incorporated by reference in its entirety.

This application is a continuation-in-part of and claims the benefit of and priority, under 35 U.S.C. §120, to application Ser. No. 14/184,639, filed on Feb. 19, 2014, and titled "Using Modeling To Determine Ion Energy Within A Plasma System", which claims the benefit of and priority to, under 35 U.S.C. §119(e), to U.S. Provisional Patent Application No. 61/799,969, filed on Mar. 15, 2013, and titled "Using Modeling To Determine Ion Energy Within A Plasma System", both of which are hereby incorporated by reference in their entirety.

FIELD

The present embodiments relate to using dual control modes within a plasma system.

BACKGROUND

In a plasma system, a generator provides power to a plasma chamber. The power provided to the plasma chamber is used to clean or etch a substrate within the plasma chamber. To properly clean or etch the substrate, the plasma should be controlled.

It is in this context that embodiments described in the present disclosure arise.

SUMMARY

Embodiments of the disclosure provide apparatus, methods and computer programs for using dual control modes within a plasma system. It should be appreciated that the present embodiments can be implemented in numerous ways, e.g., a process, an apparatus, a system, a device, or a method on a computer-readable medium. Several embodiments are described below.

In an embodiment, different variables are used to control impedance of plasma within a plasma chamber. For example, a first variable is used to control impedance of plasma during a state S1 and a second variable is used to control impedance of plasma during a state S0. The first variable is different than the second variable. For example, the first variable is RF power and the second variable is RF voltage. As another example, the first variable is RF power and the second variable is ion energy.

In one embodiment, a method for using different variables based on a state associated with a plasma system is described. The method includes determining whether the state associated with the plasma system is a first state or a second state and determining a first variable upon determining that the state is the first state. The first variable is determined based on a measurement at a communication medium. The communication medium is located between a radio frequency (RF) generator and a plasma chamber of the plasma system. The method further includes determining a second variable upon determining that the state is the second state. The second variable is determined based on a measurement at the communication medium. The method includes determining whether the second variable exceeds a first threshold, providing an instruction to reduce power supplied to the plasma chamber upon determining that the second variable exceeds the first threshold, and providing an instruction to increase power supplied to the plasma chamber upon determining that the second variable is below the first threshold. The method is executed by one or more processors.

In an embodiment, a method for using ion energy for states associated with a plasma system is described. The method includes determining whether the state associated with the plasma system is a first state or a second state, determining an ion energy associated with a plasma chamber upon determining that the state is the second state, and determining whether the ion energy matches a first ion energy threshold. The method further includes providing an instruction to change power supplied to the plasma chamber upon determining that the ion energy does not match the first ion energy threshold. The method is executed by one or more processors.

In one embodiment, a plasma system for using different variables based on a state associated with the system is described. The plasma system includes a plasma chamber. The plasma chamber includes a chuck supporting a substrate and an upper electrode located above the chuck. The plasma chamber further includes an impedance matching circuit coupled to the plasma chamber via a first communication medium and a radio frequency (RF) generator coupled to the impedance matching circuit via a second communication medium. The plasma system includes a sensor. The sensor is coupled to the first communication medium for generating a first measurement and a second measurement from RF signals transferred via the first communication medium. The plasma system includes a processor coupled to the RF generator. The processor is configured to determine whether the state associated with the plasma system is a first state or a second state and determine a first variable upon determining that the state is the first state. The first variable is determined based on the first measurement. The processor is further configured to determine a second variable upon determining that the state is the second state. The second variable is determined based on the second measurement. The processor is further configured to determine whether the second variable exceeds a first threshold, provide an instruction to reduce power supplied to the plasma chamber upon determining that the second variable exceeds the first threshold, and provide an instruction to increase power supplied to the plasma chamber upon determining that the second variable is below the first threshold.

In an embodiment, a plasma system for using different variables based on a state associated with the system is described. The plasma system includes a plasma chamber. The plasma chamber includes a chuck for supporting a substrate and an upper electrode on top of the chuck. The plasma system further includes an impedance matching circuit coupled to the plasma chamber via a first communication medium. The plasma system includes a radio frequency (RF) generator coupled to the impedance matching circuit via a second communication medium. The plasma system includes a sensor. The sensor is used for generating a first measurement and a second measurement from RF signals transferred via the first communication medium. The plasma system includes a processor coupled to the RF generator. The processor is configured to determine whether a state associated with the plasma system is a first state or a second state and determine an ion energy associated with the plasma chamber upon determining that the state is the second state. The ion energy is determined based on the first measurement. The processor is configured to determine whether the ion energy exceeds a first ion energy threshold and provide an instruction to reduce power supplied to the plasma chamber upon determining that the ion energy exceeds the first ion energy threshold. The processor is configured to provide an instruction to increase power supplied to the plasma chamber upon determining that the ion energy is below the first ion energy threshold.

Some advantages of the above-described embodiments include controlling the plasma during the first state by using the first variable than by using the second variable. For example, during the first state, it is less important to control RF power that is provided to the plasma based on a measurement of ion energy or based on a measurement of RF voltage than based on a measurement of RF power. As another example, during the first state, high energy processes, e.g., high rate etching, low rate deposition, a combination of high rate etching and low rate deposition, etc., are performed and to perform the high energy processes, it is more important to control RF power based on measurement of RF power than measurement of ion energy and/or measurement of RF voltage. The RF voltage and/or the ion energy are less relevant in controlling of the high energy processes during the first state than the RF power. As another example, current is more important to be used during the first state than voltage to facilitate performance of the high energy processes. By controlling the plasma impedance during the first state with the first variable than the second variable, the use of voltage in controlling the plasma impedance is deemphasized and the use of current in controlling the plasma impedance is emphasized.

Additional advantages of the above-described embodiments include providing better control of plasma impedance by using, during the second state, the second variable that matters more than the first variable during the second state. For example, during the second state, it is more important to control RF power provided to the plasma chamber based on a measurement of ion energy or a measurement of RF voltage than based on a measurement of RF power. As another example, during the second state, low energy processes, e.g., high rate deposition, low rate etching, a combination of low rate etching and high rate deposition, etc., are performed and to perform the low energy processes, it is more important to control RF power based on a measurement of ion energy and/or RF voltage than based on RF power. As yet another example, current is less important to be used during the second state than voltage to facilitate performance of the low energy processes. By controlling the plasma impedance during the second state with the second variable than the first variable, the use of current in controlling the plasma impedance is deemphasized and the use of voltage in controlling the plasma impedance is emphasized.

Furthermore, advantages of the above-described embodiments include providing better control of plasma impedance by using ion energy. Both RF voltage and direct current (DC) bias potential are used to determine the ion energy. The DC bias potential is a function of voltage and current. When both voltage and current are used to determine an amount of power by which to control plasma impedance, control of the plasma impedance is more accurately done than when voltage is used to control the plasma impedance. Also, when both DC bias and RF voltage are used to determine power to be used to control plasma impedance, the control is more accurately exercised compared to when the DC bias or the RF voltage is used. Hence, the ion energy provides better control of plasma impedance of plasma within the plasma chamber.

Other aspects will become apparent from the following detailed description, taken in conjunction with the accompanying drawings.

BRIEF DESCRIPTION OF THE DRAWINGS

The embodiments may best be understood by reference to the following description taken in conjunction with the accompanying drawings.

DETAILED DESCRIPTION

The following embodiments describe systems and methods for using dual control modes within a plasma system. It will be apparent that the present embodiments may be practiced without some or all of these specific details. In other instances, well known process operations have not been described in detail in order not to unnecessarily obscure the present embodiments.

Figure 1A:
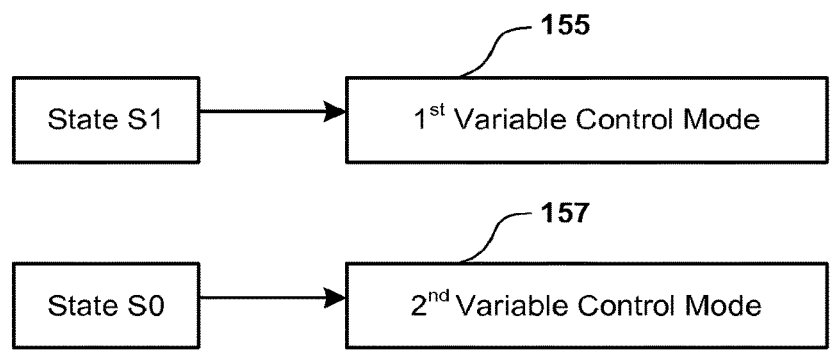
FIG. 1A is a diagram that is used to illustrate systems and methods for using different variables based on a state associated with a plasma system, in accordance with an embodiment described in the present disclosure.

FIG. 1A is a diagram that is used to illustrate systems and methods for using variables based on a state associated with a plasma system. When a state associated with the plasma system is S1, the plasma system is operated in a first variable control mode 155. Examples of the state S1 include a high value, a state having a value of 1, and an on state, etc. During the first variable control mode 155, a first variable associated with plasma of the plasma system is measured and impedance of the plasma is controlled based on one or more values of the first variable. Examples of the first variable include voltage, current, power, impedance, ion energy, bias potential, and a combination thereof.

Moreover, when a state associated with the plasma system is S0, the plasma system is operated in a second variable control mode 157. Examples of the state S0 include a low value, a state having a value of 0, and an off state, etc. The low value is less than the high value. During the second variable control mode 157, a second variable associated with plasma of the plasma system is measured and impedance of the plasma is controlled based on one or more values of the second variable. Examples of the second variable include voltage, current, power, impedance, ion energy, bias potential, and a combination thereof.

In various embodiments, power includes supplied power or reflected power or delivered power. Supplied power is power that is supplied by an RF generator via an impedance matching circuit and an RF transmission line to a plasma chamber. Reflected power is power that is reflected from a plasma chamber via the RF transmission line and an impedance matching circuit to the RF generator. Delivered power is a difference between supplied power and reflected power.

In some embodiments, the second variable is other than the first variable. For example, the second variable is not the same as the first variable. To illustrate, when the first variable is power associated with plasma within the plasma system, the second variable is ion energy associated with the plasma. To further illustrate, when the first variable is power associated with plasma within the plasma system, the second variable is a radio frequency (RF) voltage associated with the plasma. As yet another illustration, when the first variable is RF current associated with plasma within the plasma system, the second variable is RF voltage associated with the plasma or ion energy associated with the plasma. As another illustration, when the first variable is bias potential associated with plasma within the plasma system, the second variable is RF voltage associated with the plasma or ion energy associated with the plasma.

In various embodiments, the first variable is the same as the second variable. For example, both the first and second variables are RF power, RF voltage, or ion energy.

Figure 1B:
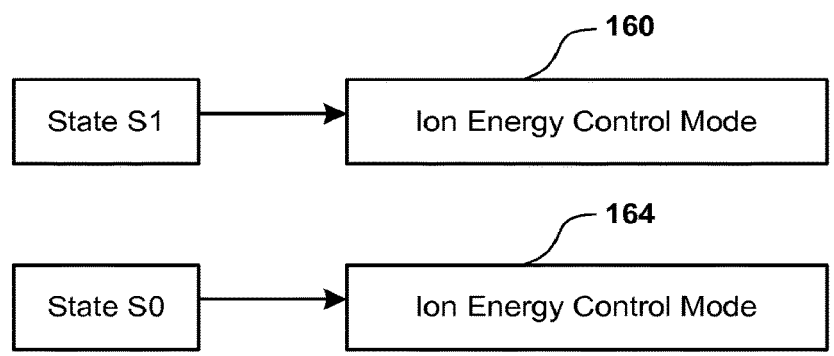
FIG. 1B is a diagram that is used to illustrate systems and methods for using ion energy during both states associated with a plasma system, in accordance with an embodiment described in the present disclosure.

FIG. 1B is a diagram illustrating use of ion energy control modes 160 and 164 during both the states S1 and S0. During each ion energy control mode 160, ion energy associated with plasma within the plasma system is controlled. For example, ion energy associated with plasma within the plasma system is measured or determined and impedance of the plasma is controlled based on one or more values of the ion energy.

Figure 2:
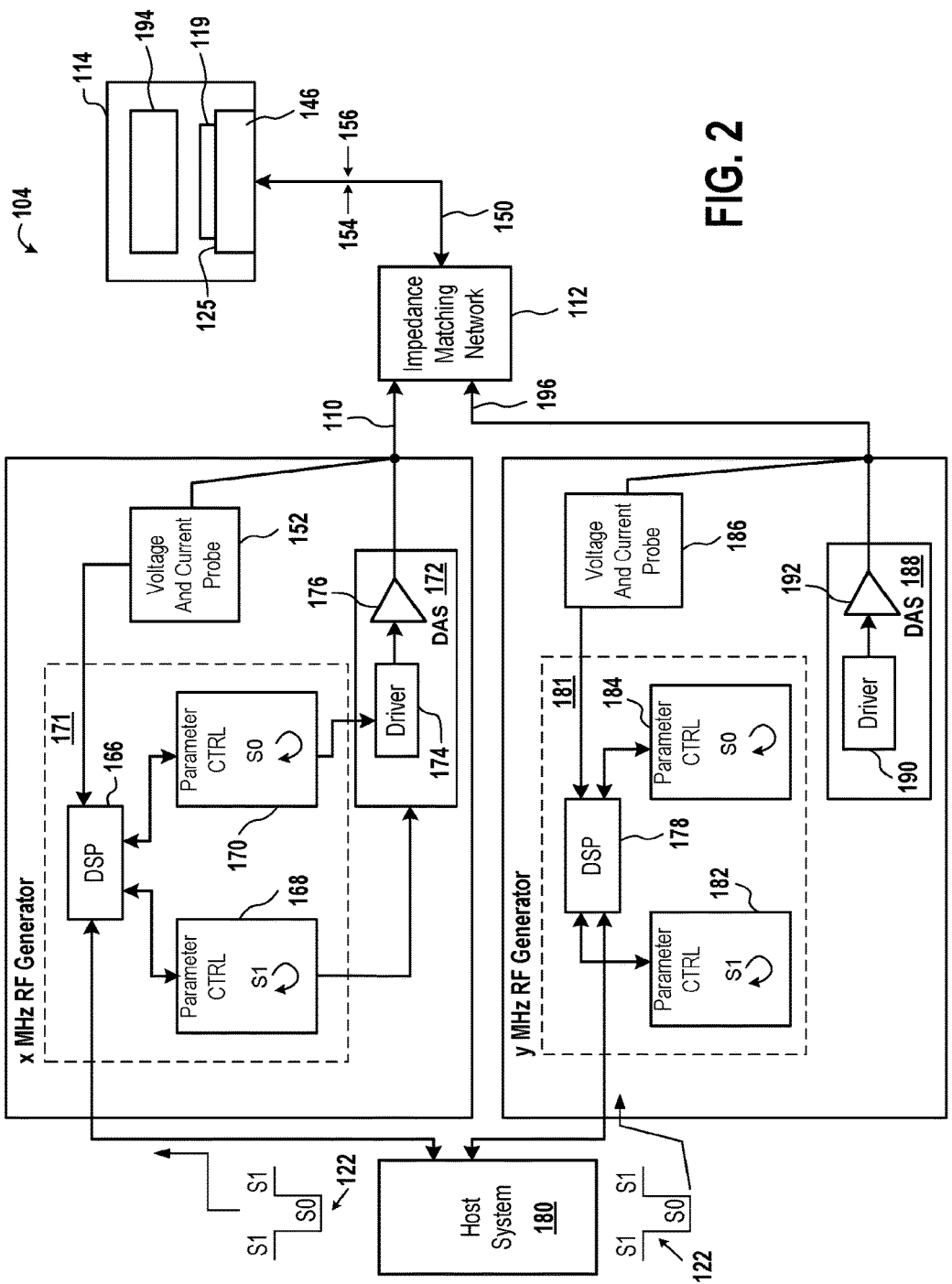
FIG. 2 is a block diagram of an embodiment of a plasma system, in accordance with an embodiment described in the present disclosure.

FIG. 2 is a block diagram of an embodiment of a plasma system 104. The plasma system 104 includes a host system 180 that is coupled to an x MHz RF generator and to a y MHz RF generator. Examples of x MHz include 2 MHz, 27 MHz, and 60 MHz. Examples of y MHz include 2 MHz, 27 MHz, and 60 MHz. In some embodiments, x MHz is different than y MHz. For example, when x MHz is 2 MHz, y MHz is 27 or 60 MHz. As another example, when x MHz is 27 MHz, y MHz is 60 MHz. In an embodiment, the host system 180 is coupled to any number of RF generators. Examples of the host system 180 include a computing device, e.g., a desktop computer, a laptop computer, a smart phone, a tablet, etc.

The plasma system 104 further includes an impedance matching network 112 and a plasma chamber 114. The impedance matching network 112 includes electric circuit components, e.g., inductors, capacitors, etc. to match an impedance of a load coupled to the impedance matching network 112 with an impedance of a source coupled to the network 112. For example, the impedance matching network 112 matches an impedance of one or more parts, e.g., the plasma chamber 114, an RF transmission line 150, etc., of the plasma system 104 that are coupled to the impedance matching network 112 on one side with one or more parts, e.g., the x MHz RF generator, the y MHz RF generator, communication mediums 110 and 196, etc., of the plasma system 104 that are coupled to the impedance matching network 112 on another side. In one embodiment, the impedance matching network 112 is tuned to facilitate a match between an impedance of the load with an impedance of the source. An impedance match between a load and a source reduces chances of power being reflected from the load towards the source. Examples of a communication medium include an RF rod, a cable, a wire, an RF strap, or any other conductive device that facilitates transfer of an RF signal.

The plasma chamber 114 includes an electrostatic chuck (ESC) 146, an upper electrode 194, and other parts (not shown), e.g., an upper dielectric ring surrounding the upper electrode 194, an upper electrode extension surrounding the upper dielectric ring, a lower dielectric ring surrounding a lower electrode of the ESC 146, a lower electrode extension surrounding the lower dielectric ring, an upper plasma exclusion zone (PEZ) ring, a lower PEZ ring, etc. The upper electrode 194 is located opposite to, on top of, and facing the ESC 146. A work piece 119, e.g., a substrate, etc., is supported on an upper surface 125 of the ESC 146. An example of a substrate includes a semiconductor wafer. Another example of a substrate includes a wafer on which electrical circuitry, e.g., circuitry including transistors, resistors, capacitors, logic gates, etc., is fabricated. Integrated circuits, e.g., application specific integrated circuit (ASIC), programmable logic device (PLD), etc. are developed on the work piece 119 and the integrated circuits are used in a variety of electronic devices, e.g., cell phones, tablets, smart phones, computers, laptops, networking equipment, etc. Each of the upper electrode 194 and the lower electrode is made of a metal, e.g., aluminum, alloy of aluminum, copper, etc.

In one embodiment, the upper electrode 194 includes a hole that is coupled to a central gas feed (not shown). The central gas feed receives one or more process gases from a gas supply (not shown). Examples of a process gases include an oxygen-containing gas, such as $O_2$. Other examples of a process gas include a fluorine-containing gas, e.g., tetrafluoromethane ($CF_4$), sulfur hexafluoride ($SF_6$), hexafluoroethane ($C_2F_6$), etc.

In some embodiments, the upper electrode 194 is grounded.

The ESC 146 is coupled to the x MHz RF generator and the y MHz RF generator via the impedance matching network 112, the RF transmission line 150, and communication mediums 110 and 196. The RF transmission line 150 includes one or more communication mediums, e.g., RF rods, RF straps, cables, wires, connectors, or a combination thereof, etc., to transfer an RF signal between the impedance matching network 112 and the plasma chamber 114.

When the process gas is supplied between the upper electrode 194 and the ESC 146 and when the x MHz RF generator and/or the y MHz RF generator supplies power via the impedance matching network 112 to the ESC 146, the process gas is ignited to generate plasma within the plasma chamber 114.

The host system 180 generates a digital pulsing signal 122 that has two states S1 and S0. In one embodiment, a state associated with the plasma system 104 is the same as the state of the digital pulsing signal 122. As an example, the digital pulsing signal 122 has a 50% duty cycle, one for a state. As another example, the digital pulsing signal 122 has a duty cycle other than 50%. In this example, the higher duty cycle is for one state and the lower duty cycle is for another state. In one embodiment, instead of using the host system 180 to generate the digital pulsing signal 122, a clock source, e.g., an oscillator, is used to generate a clock signal, which is an example of the digital pulsing signal 122.

The digital pulsing signal 122 is sent by the host system 180 to a digital signal processor (DSP) 166 of the x MHz RF generator and to a DSP 178 of the y MHz RF generator. Examples of a processor include an ASIC, a PLD, a microprocessor, a microcontroller, a central processing unit (CPU), etc.

Upon receiving the digital pulsing signal 122, each DSP 166 and 178 determines whether a state of the digital pulsing signal 122 is S1 or S0. For example, the DSP 166 distinguishes between the states S0 and S1. As another example, the DSP 166 determines that the digital pulsing signal 122 has a first magnitude, e.g., the value of 1, the high value, etc., during a first set of time periods and has a second magnitude, e.g., the value of 0, the low value, etc., during a second set of time periods. The DSP 166 determines that the digital pulsing signal 122 has the state S1 during the first set of time periods and has the state S0 during the second set of time periods. As yet another example, the DSP 166 compares a magnitude of the digital pulsing signal 122 with a pre-stored value to determine that the magnitude of the digital pulsing signal 122 is greater than the pre-stored value during the first set of time periods and that the magnitude during the state S0 of the digital pulsing signal 122 is not greater than the pre-stored value during the second set of time periods. In the embodiment in which the clock oscillator is used, the DSP 166 receives an analog clock signal from the clock oscillator, converts the analog signal into a digital form, and then identifies the two states S0 and S1.

When the state associated with the plasma system 104 is S1, the DSP 166 generates a parameter value Px1 and provides the parameter value Px1 to a parameter control 168 of the x MHz RF generator. Examples of a parameter include frequency, power, etc. Moreover, when the state associated with the plasma system 104 is S1, a DSP 178 of the y MHz RF generator generates a parameter value Py1 and provides the parameter value Py1 to a parameter control 182 of the y MHz RF generator.

Similarly, when the state associated with the plasma system 104 is S0, the DSP 166 generates a parameter value Px0 and provides the parameter value Px0 to a parameter control 170 of the x MHz RF generator. Also, when the state associated with the plasma system 104 is S0, the DSP 178 generates a parameter value Py0 and provides the parameter value Py0 to a parameter control 184 of the y MHz RF generator.

It should be noted that in one embodiment, a parameter control of an RF generator is a portion of a computer program that is embodied within a computer-readable medium and that is executed by a DSP of the RF generator. For example, the parameter control 168 and the parameter control 170 are logic blocks, e.g., tuning loops, which are portions of a computer program that is executed by the DSP 166. As another example, the parameter control 182 and the parameter control 184 are logic blocks of a computer program that is executed by the DSP 178.

In some embodiments, a computer program is embodied within a non-transitory computer-readable medium, e.g., a storage device. Examples of a storage device include a read-only memory (ROM), a random access memory (RAM), or a combination thereof. To illustrate, a storage device includes a hard disk, a Flash memory, a redundant array of independent disks, etc.

In an embodiment, a hardware controller, e.g., a microcontroller, an ASIC, a PLD, etc., is used instead of a parameter control. For example, a controller is used instead of the parameter control 168, another controller is used instead of the parameter control 170, yet another controller is used instead of the parameter control 182, and another controller is used instead of the parameter control 184. In some embodiments, a hardware controller includes a processor and storage device.

The parameter control 168, the parameter control 170, and the DSP 166 are parts of a control system 171 and the parameter control 182, the parameter control 184, and the DSP 178 are parts of a control system 181.

During the state S1 associated with the plasma system 104, the parameter control 168 that is coupled to the DSP 166 and to a DAS 172 of the x MHz RF generator receives the parameter value Px1 from the DSP 166. Based upon the parameter value Px1, the x MHz RF generator generates an RF signal on the communication medium 110 and the RF signal is sent from the x MHz RF generator via the communication medium 110 to the impedance matching network 112. For example, the parameter control 168 looks-up a drive parameter value corresponding to the parameter value Px1 to provide to a driver 174 of the DAS 172. The communication medium 110 couples the x MHz RF generator to the impedance matching network 112.

The driver 174 generates an RF signal having the drive parameter value and provides the RF signal to an amplifier 176 of the DAS 172. In one embodiment, a drive parameter value is the same as the parameter value Px1. The amplifier 176 may amplify the drive parameter value to generate an RF signal having an amplified parameter value, which may be the same as the drive parameter value of an RF signal that is received by the amplifier 176 from the driver 174. The RF signal having the amplified parameter value is supplied by the DAS 172 via the communication medium 110 to the impedance matching network 112.

Similarly, during the state S1 associated with the plasma system 104, a DAS 188 that includes a driver 190 and an amplifier 192 generates an RF signal that is sent via the communication medium 196 to the impedance matching network 112. The communication medium 196 couples the y MHz RF generator to the impedance matching network 112.

The RF signals received from the x MHz RF generator via the communication medium 110 and from the y MHz generator via the communication medium 196 are combined, e.g., added, summed, etc., in the impedance matching network 112 to generate an RF signal 154 during the state S1. In some embodiments, the impedance matching network 112 combines the RF signals received from the x and y MHz RF generators to match an impedance of the load with the source to further generate an RF signal. The RF signal 154 is transferred via the RF transmission line 150 to the ESC 146 to provide RF power to the lower electrode of the ESC 146.

Moreover, during the state S0 associated with the plasma system 104, the parameter control 170 that is coupled to the DSP 166 and to the DAS 172 receives the parameter value Px0 from the DSP 166. Based upon the parameter value Px0, the x MHz RF generator generates an RF signal that is sent from the x MHz RF generator via the communication medium 110 to the impedance matching network 112. For example, the parameter control 170 looks-up a drive parameter value corresponding to the parameter value Px0 to provide to the driver 174. The driver 174 generates an RF signal having a drive parameter value and provides the RF signal to the amplifier 176. In one embodiment, the drive parameter value is the same as the parameter value Px0. The amplifier 176 may amplify the drive parameter value to generate an RF signal having an amplified parameter value, which may be the same as the drive parameter value of an RF signal that is received by the amplifier 176 from the driver 174. The RF signal having the amplified parameter value is supplied by the DAS 172 via the communication medium 196 to the impedance matching network 112.

Similarly, during the state S0 associated with the plasma system 104, the DAS 188 generates an RF signal that is sent via the communication medium 196 to the impedance matching network 112. The RF signals received from the x MHz RF generator and the y MHz RF generator are combined in the impedance matching network 112 to generate an RF signal 156 during the state S0. The RF signal 156 is provided via RF transmission line 150 to lower electrode of the ESC 146 of the plasma chamber 114.

It should be noted that in response to power supplied within the RF signal 154 and the RF signal 156, power is reflected from the plasma chamber 114 towards the x MHz RF generator and the y MHz RF generator. For example, in response to forward supplied within the RF signals 154 and 156, power is reflected from the plasma chamber 114 via the RF transmission line 150, the impedance matching network 112, and the communication medium 110 to the x MHz RF generator. As another example, in response to supplied power within the RF signals 154 and 156, power is reflected from the plasma chamber 114 via the RF transmission line 150, the impedance matching network 112, and the communication medium 196 to the y MHz RF generator.

In some embodiments, forward power and supplied power are used interchangeably herein.

A voltage and current (VI) probe 152 of the x MHz RF generator senses power, e.g., supplied power, reflected power, delivered power, etc., communicated along the communication medium 110. In some embodiments, the terms probe and sensor are used interchangeably. Similarly, a voltage and current probe 186 of the y MHz RF generator senses power communicated along the communication medium 196.

An example of each voltage and current probe 152 and 186 includes a voltage and current probe that complies with a pre-set formula. An example of the pre-set formula includes a standard that is followed by an Association, which develops standards for sensors. Another example of the pre-set formula includes a National Institute of Standards and Technology (NIST) standard. As an illustration, the voltage and current probe 152 or 186 is calibrated according to NIST standard. In this illustration, the voltage and current probe 152 or 186 is coupled with an open circuit, a short circuit, or a known load to calibrate the voltage and current probe 152 or 186 to comply with the NIST standard. The voltage and current probe 152 or 186 may first be coupled with the open circuit, then with the short circuit, and then with the known load to calibrate the voltage and current probe 152 or 186 based on NIST standard. The voltage and current probe 152 or 186 may be coupled to the known load, the open circuit, and the short circuit in any order to calibrate the voltage and current probe 152 or 186 according to NIST standard. Examples of a known load include a 50 ohm load, a 100 ohm load, a 200 ohm load, a static load, a direct current (DC) load, a resistor, etc. As an illustration, each voltage and current probe 152 or 186 is calibrated according NIST-traceable standards.

Although two RF generators are shown in FIG. 2, in some embodiments, any number of RF generators is used. For example, in addition to a 2 MHz RF generator and a 27 MHz RF generator, a 60 MHz RF generator may be used. As another example, the x MHz RF generator is used without using any other RF generator.

It should further be noted that the RF signal 154 generated during the state S1 and the RF signal 156 generated during the state S0 are portions of a combined RF signal that is transferred via the RF transmission line 150. For example, the RF signal 154 is a portion of the combined RF signal. In this example, the RF signal 154 has a higher amount of power than the RF signal 156, which is another portion of the combined RF signal.

In some embodiments, each of the first variable and the second variable is a modeled variable. For example, a processor of the host system 180 generates a model of one or more parts, e.g., the communication medium 110, the communication medium 196, the impedance matching network 112, the RF transmission line 150, the ESC 146, etc., of the plasma system 104. For example, the processor of the host system 180 generates a model of electrical components, e.g., capacitors, inductors, resistors, etc., of a part of the plasma system 104. As another example, when an inductor of the impedance matching network 112 is connected in series with a capacitor of the impedance matching network 112, an inductor of an impedance matching model is also connected in series with a capacitor of the impedance matching network 112.

In the embodiments in which each of the first variable and the second variable is a modeled variable, a model includes electrical elements, e.g., inductors, capacitors, resistors, etc., and the electrical elements have similar characteristics as that of electrical components of a part of the plasma system 104. For example, the model has the same inductance and/or capacitance and/or resistance as that of a part of the plasma system 104. As another example, an impedance matching model has the same impedance and/or capacitance as that of the impedance matching network 112.

Moreover, in the embodiments in which each of the first variable and the second variable is a modeled variable, a voltage and current probe measures a complex voltage and current at an output of an RF generator. For example, the voltage and current probe 152 measures a complex voltage and current at an output of the x MHz RF generator and the voltage and current probe 186 measures a complex voltage and current at an output of the y MHz RF generator. The output of an RF generator is coupled to an RF cable. For example, the output of the x MHz RF generator is coupled to the communication medium 110 and the output of the y MHz RF generator is coupled to the communication medium 196. As an example, a complex voltage and current includes a voltage magnitude, a current magnitude, and a phase between the voltage and current magnitudes. In various embodiments, a magnitude is a root mean square value or a zero-to-peak value or a peak-to-peak value. The complex voltage and current is provided from the voltage and current probe via a cable, e.g., a serial cable, a parallel cable, a Universal Serial Bus (USB) cable, etc., to the processor of the host system 180.

Furthermore, in the embodiments in which each of the first variable and the second variable is a modeled variable, the complex voltage and current received from the voltage and current probe by the processor of the host system 180 is propagated via elements of one or more models of one or more parts of the plasma system 104. For example, a directional sum of the complex voltage and current received from a voltage and current probe and of a complex voltage and current consumed by elements of a model is calculated to generate a complex voltage and current at a model node. Examples of the model node include a node at an input of a model, or an output of the model, or within the model. For example, a model node is an output of a model of an RF strap of the RF transmission line 150. In this example, the model of the RF strap is connected to a model of an RF rod of the RF transmission line 150. As another example, a model node is a node at an output of a model of the impedance matching network 112. As yet another example, a model node is a node at an input of a model of the ESC 146 or at an output of the ESC 146.

Figure 3:
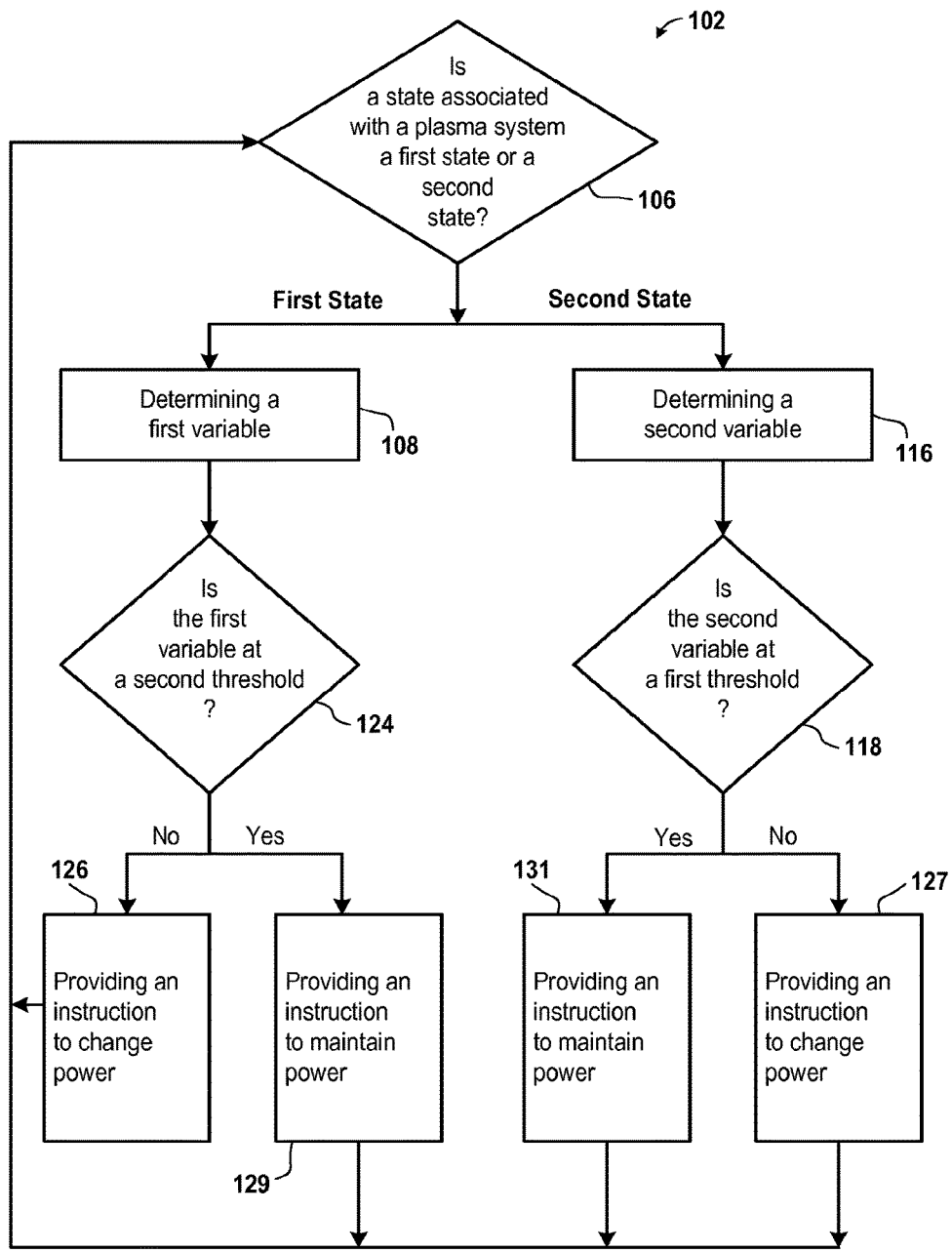
FIG. 3 is a flowchart of an embodiment of a method for using different variables based on a state associated with the plasma system of FIG. 2, in accordance with an embodiment described in the present disclosure.

FIG. 3 is a flowchart of an embodiment of a method 102 for using different variables based on a state associated with the plasma system 104 (FIG. 2). The method 102 is executed by one or more processors, e.g., the processor of the host system 180 (FIG. 2), the DSP 166, the DSP 178 (FIG. 2), a combination of the processor of the host system 180 and the DSP 166, a combination of the processor of the host system 180 and the DSP 178, etc.

In an operation 106, it is determined whether a state associated with the plasma system 104 is a first state, e.g., the state S1, or a second state, e.g., the state S0. For example, as described above, the plasma system 104 is associated with the first state when the digital pulsing signal 122 has the state S1. As another example, as described above, the plasma system 104 is associated with the second state when the digital pulsing signal 122 has the state S0.

Upon determining that the state associated with the plasma system 104 is the first state, in an operation 108, the first variable is determined. The first variable is determined based on a measurement at the communication medium 110 (FIG. 2) when the communication medium is transferring an RF signal during the state S1. For example, the voltage and current probe 152 measures the complex voltage and current at the communication medium 110 when the communication medium 110 is transferring an RF signal during the state S1, and provides the measured complex voltage and current to a processor of the host system 180 (FIG. 2) via the DSP 166 (FIG. 2). As another example, a sensor, similar to the voltage and current probe 152, measures the complex voltage and current at the RF transmission line 150 when the RF transmission line 150 is transferring the RF signal 154, and provides the measured complex voltage and current to the processor of the host system 180 via the DSP 166. Upon receiving the measured complex voltage and current from a voltage and current probe, e.g., the voltage and current probe 152 or the voltage and current probe coupled to the RF transmission line 150, etc., the processor of the host system 180 determines RF power, which is provided by the complex voltage and current. The RF power that is determined is an example of the first variable. As yet another example, the first variable at a model node is determined.

In one embodiment, the RF transmission line 150 is an example of a communication medium.

On the other hand, upon determining that the state associated with the plasma system 104 is the second state, in an operation 116, the second variable is determined. For example, when the RF signal 156 is transferred to the plasma chamber 114, the voltage and current probe 152 measures the complex voltage and current at the communication medium 110 and provides the measured complex voltage and current to a processor of the host system 180 (FIG. 2) via the DSP 166 (FIG. 2). As another example, when the RF signal 156 is transferred to the plasma chamber 114, a sensor, similar to the voltage and current probe 152 (FIG. 2), measures the complex voltage and current at the RF transmission line 150 and provides the measured complex voltage and current to the processor of the host system 180 via the DSP 166. Upon receiving the measured complex voltage and current from a voltage and current probe, e.g., the voltage and current probe 152 or the voltage and current probe coupled to the RF transmission line 150, the processor of the host system 180 determines an RF voltage, which is the same as the measured complex voltage. In some embodiments, the processor of the host system 180 ignores the measured current upon receiving the measured complex current and voltage during the second state. As another example, upon receiving the measured complex voltage and current from a voltage and current probe, the processor of the host system 180 determines an ion energy, which is a function of an RF voltage and a direct current (DC) bias potential.

In various embodiments, a determination of the ion energy is performed by a processor of the plasma system 104. For example, the ion energy is calculated as a sum of a coefficient "C1" multiplied by a wafer bias, e.g., modeled bias, etc., at a model node and a coefficient "C2" multiplied by a peak magnitude of a voltage. Examples of the coefficient "C1" include a negative real number and of the coefficient "C2" include a positive real number.

In various embodiments, wafer bias and DC bias potential are used interchangeably herein.

In various embodiments, the coefficient "C1" is a positive real number. In various embodiments, the coefficient "C2" is a negative real number. The coefficients "C1" and "C2", the wafer bias, and the peak magnitude used to determine the ion energy are stored in a storage device of the plasma system 104. Examples of the peak magnitude used to determine the ion energy include a peak-to-peak magnitude and a zero-to-peak magnitude.

In some embodiments, the peak magnitude used to determine the ion energy is extracted by a processor of the plasma system 104 from a complex voltage and current determined at a model node.

In various embodiments, the peak magnitude used to calculate the ion energy is measured by a voltage and current probe that is coupled to an input or an output of a part of the plasma system 104 at one end and to a processor of the plasma system 104 at another end. The voltage and current probe coupled to the input or output at one end and to a processor of the plasma system 104 at another end is capable of distinguishing between frequencies of two or more RF generators.

In some embodiments, both the peak magnitude and wafer bias used to determine the ion energy is at a model node. For example, the peak magnitude used to determine the ion energy is extracted from a complex voltage and current at a model node, and the wafer bias used to determine the ion energy is calculated at the model node. As another example, the peak magnitude used to determine the ion energy is extracted from complex voltage and current at a model node of a model of the ESC 146, and the wafer bias used to determine the ion energy is calculated at the model node.

In a variety of embodiments, the peak magnitude used to determine the ion energy is extracted from a complex voltage and current at a first model node and wafer bias used to determine the ion energy is determined at a second model node, other than the first model node. For example, the peak magnitude used to determine the ion energy is extracted from complex voltage and current at a model node at an output of the ESC 146, and the wafer bias used to determine the ion energy is calculated at a model node at an input of the ESC 146.

The ion energy calculated using a model node removes a need to use an expensive voltage and current probe to measure the peak magnitude and also removes a need to use a bias compensation circuit to measure the wafer bias. An example of the bias compensation circuit includes a silicon carbide pin.

In some embodiments, instead of the peak magnitude used to determine the ion energy, a root mean square magnitude is used.

In various embodiments, when multiple RF generators are on, the peak magnitude used to determine the ion energy is a peak voltage of a statistical value, e.g., median, mean, etc., of peak RF voltages of the RF generators that are on. For example, the Vpeak is an average of peak magnitudes that are measured by the voltage and current probes 152 and 186 at the outputs of the x and y MHz RF generators.

In one embodiment, the DC bias potential is measured using the bias compensation circuit, e.g., a DC sensor, etc. For example, the bias compensation circuit may be immersed in the plasma of the plasma chamber 114 (FIG. 2) to measure the DC bias potential. In various embodiments, the DC sensor is coupled to the communication medium 110 or the RF transmission line 150 to measure the DC bias potential.

In embodiments in which the x MHz RF generator is operational, e.g., is on, is not malfunctioning, is functioning, is on, etc., and the y MHz RF generator is inoperational, e.g., is off, is malfunctioning, is not operating, etc., the DC bias potential is determined by a processor of the plasma system 104 according to an equation:

$$ax*Vx+bx*Ix++cx*sqrt(Px)+dx \quad (1)$$

where "*" represents multiplication, "sqrt" is a square root, "Vx" represents a voltage magnitude at a model node, "Ix" represents a current magnitude at the model node, "Px" represents a magnitude of power at the model node, "ax" is a coefficient, "bx" is a coefficient, "cx" is a coefficient, and "dx" represents a constant value. In some embodiments, a power magnitude used to determine the wafer bias at a model node is a product of a voltage magnitude at the model node, a current magnitude at the model node, and a cosine of a phase between the voltage magnitude and the current magnitude. In various embodiments, a power magnitude is a magnitude of delivered power, which includes a difference between forward power and reflected power. The coefficients ax, bx, and cx, and the constant dx are stored within a storage device of the host system 180 (FIG. 2).

In embodiments in which the x MHz RF generator is operational and the y MHz RF generator is operational, the DC bias potential is determined by a processor of the plasma system 104 according to an equation:

$$axy*Vx+bxy*Ix+cxy*sqrt(Px)+dxy*Vy+exy*Iy+\\ fxy*sqrt(Py)+gxy \quad (2)$$

where "*" represents multiplication, "Vx" represents a voltage magnitude at a model node, "Ix" represents a current magnitude at the model node, "Px" represents a magnitude of power at the model node, "Vy" represents a voltage magnitude at the model node, "Iy" represents a current magnitude at the model node, "Py" represents a magnitude of power at the model node, and each of "axy", "bxy", "cxy", "dxy", "exy", "fxy" is a coefficient, and "gxy" is a constant. In some embodiments, the voltage Vy at the model node is a result of propagating a complex voltage and current measured by the voltage and current probe 186 of the y MHz RF generator via a model of the communication medium 196 and via a model of a branch of the impedance matching network 112 that is coupled to the communication medium 196. It should be noted that in various embodiments, Py is a product of Vy, Iy, and a cosine of a phase between Vy and Iy. The coefficients axy, bxy, cxy, dxy, exy, fxy, and the constant gxy are stored within a storage device of the host system 180 (FIG. 2).

In embodiments in the x MHz RF generator, the y MHz RF generator, and a z MHz RF generator are operational, the DC bias potential is determined by a processor of the plasma system 104 according to an equation:

$$axyz*Vx+bxyz*Ix+cxyz*sqrt(Px)+dxyz*Vy+\\ exyz*Iy+fxyz*sqrt(Py)+gxyz*Vz+hxyz*Iz+\\ ixyz*sqrt(Pz)+jxyz \quad (3)$$

where "*" represents multiplication, "Vx" represents a voltage magnitude at a model node, "Ix" represents a current magnitude at the model node, "Px" represents a magnitude of power at the model node, "Vy" represents a voltage magnitude at the model node, "Iy" represents a current magnitude at the model node, "Py" represents a magnitude of power at the model node, "Vz" represents a voltage magnitude at the model node, "Iz" represents a current magnitude at the model node, "Pz" represents a magnitude of power at the model node, each of "axyz", "bxyz", "cxyz", "dxyz", "exyz", "fxyz", "gxyz", "hxyz", "ixyz" is a coefficient, and "jxyz" is a constant. In some embodiments, the voltage Vz at the model node is a result of propagating a complex voltage and current measured by a voltage and current probe of the z MHz RF generator via a model of an RF cable that is connected to the z MHz RF generator and via a model of a branch of the impedance matching network 112 that is coupled to the RF cable. It should be noted that in various embodiments, Pz is a product of Vz, Iz, and a cosine of a phase between Vz and Iz. The coefficients axyz, bxyz, cxyz, dxyz, exyz, fxyz, gxyz, hxyz, ixyz, and the constant jxyz are stored within a storage device of the host system 180 (FIG. 2).

In a number of embodiments, the voltage magnitudes, the current magnitudes, and the power magnitudes, e.g., Vx, Ix, Px, Vy, Iy, Py, Vz, Iz, Pz, etc., used to determine a wafer bias are not modeled and instead are measured, by a number of voltage and current probes at a node within the plasma system 104 (FIG. 2), e.g., an output of the impedance matching network 112 (FIG. 2), an output of the RF transmission line 150 (FIG. 2), at a point within the RF transmission line 150, at the ESC 146 (FIG. 2), etc., to determine the wafer bias at the node of the plasma system 104. For example, a voltage and current probe is coupled to the output of the RF transmission line 150 to measure current and voltage at the output, is coupled to the point within the RF transmission line 150 to measure current and voltage at the point, or the ESC 146 to measure current and voltage at the ESC 146.

In an operation 118, it is determined whether the second variable meets a first threshold. For example, it is determined whether the second variable exceeds the first threshold or is lower than the first threshold. The first threshold is stored within a storage device, e.g., a storage device of the host system 180 (FIG. 2) or any other storage device of the plasma system 104. It should be noted that the first threshold is an ion energy threshold when the second variable is ion energy and that the first threshold is an RF voltage threshold when the second variable is RF voltage.

Upon determining that the second variable exceeds the first threshold, in an operation 127, an instruction is provided to change power of the RF signal 156 (FIG. 2). For example, upon determining that the second variable exceeds the first threshold, in an operation 120, an instruction is provided to reduce power of the RF signal 156. As an illustration, the processor of the host system 180 provides an instruction to the DSP 166 (FIG. 2) to reduce power from the power value Px0 to a power value at which the second variable does not exceed the first threshold. Upon receiving an instruction to reduce power, the DSP 166 decreases the parameter value Px0, e.g., a power value Px0, etc., to a power value "Px0−1" lower than the power value Px0 and provides the lowered power value to the parameter control 170 (FIG. 2). In some embodiments, the processor of the host system 180 performs the task of decreasing the power value Px0 to the lowered power value "Px0−1".

The parameter control 170 generates a drive power value based on the lowered power value "Px0−1" in a manner similar to that described above of generating a drive parameter value from the parameter value Px0. The parameter control 170 provides the drive power value generated based on the received power value "Px0−1" to the DAS 172. The DAS 172 generates an RF signal based on the drive power value that is based on the lowered power value "Px0−1" in a similar manner to that described above for generating an RF signal from a drive power value that is based on the power value Px0 and provides an RF signal via the impedance matching network 112 (FIG. 2) to the lower electrode of the ESC 146 (FIG. 2).

The operations 106, 116, 118, and 127 are iteratively repeated until the power value Px0 is reduced to a value at which the second variable does not exceed the first threshold. To illustrate, after reducing the power value from Px0 to the power value "Px0−1", the second variable is determined based on a voltage at a model node or an RF voltage that is measured at the communication medium 110 or at the RF transmission line 150. It is determined whether the second variable corresponding to the power value "Px0−1" exceeds the first threshold. Upon determining that the second variable corresponding to the power value "Px0−1" exceeds the first threshold, the power value "Px0−1" is further reduced to a power value "Px0−2" and the operations 106, 116, and 118 are repeated.

It should be noted that in an embodiment, to iteratively determine the power value at which the second variable does not exceed the first threshold, the operation 106 is not repeated. Rather, the operations 116, 118, and 127 are iteratively repeated.

On the other hand, upon determining that the second variable does not exceed and does not meet the first threshold, in the operation 118, it is further determined whether the second variable is less than the first threshold. Upon determining that the second variable is less than the first threshold, in the operation 127, an instruction is provided by the processor of the host system 180 to change, e.g., increase, the power value Px0. For example, the processor of the host system 180 provides an instruction to the DSP 166 to increase power from the power value Px0 and the DSP 166 increases the power value Px0 to a power value "Px0+1". In one embodiment, the processor of the host system 180 increases the power value Px0 to the power value "Px0+1" and provides the power value "Px0+1" to the DSP 166.

The DSP 166 provides the power value "Px0+1" to the parameter control 170. The parameter control 170 generates a drive power value based on the power value "Px0+1" in a manner similar to that described above of generating the drive power value from the power value Px0. The parameter control 170 provides the drive power value to the DAS 172. Upon receiving the drive power value the DAS 172 generates an RF signal based on the drive power value in a manner similar to that described above of generating the RF signal 156 from a drive power value that is based on the power value Px0 and provides the RF signal via the impedance matching network 112 (FIG. 2) to the lower electrode of the ESC 146 (FIG. 2).

The operations 106, 116, 118, and 127 are iteratively repeated until the power value Px0 is increased to a value at which the second variable is not lower than the first threshold. To illustrate, after increasing the power value from Px0 to the power value "Px0+1", the second variable is determined based on an RF voltage that is measured at the communication medium 110 or at the RF transmission line 150. It is determined whether the second variable corresponding to the power value "Px0+1" is less than the first threshold. Upon determining that the second variable corresponding to the power value "Px0+1" is less than the first threshold, the power value "Px0+1" is further increased to a power value "Px0+2" and the operations 106, 116, 118, and 127 are repeated.

It should be noted that in an embodiment, to iteratively determine the power value at which the second variable is not less than the first threshold, the operation 106 is not repeated. Rather, the operations 116, 118 and 127 are repeated. The method 102 is repeated after the operation 127.

On the other hand, upon determining that the second variable matches the first threshold, e.g., is not less than the first threshold and does not exceed the first threshold, in an operation 131, an instruction is provided to maintain the power value Px0. For example, the processor of the host system 180 provides an instruction to the DSP 166 to continue to provide the power value Px0 to the parameter control 170. In one embodiment, the processor of the host system 180 provides the power value Px0 to the DSP 166 and the DSP 166 provides the power value Px0 to the parameter control 170. The method 102 repeats after the operation 131.

In an operation 124, it is determined whether the first variable meets a second threshold. For example, it is determined whether the first variable exceeds the second threshold. The second threshold is stored within a storage device, e.g., a storage device of the host system 180 or any other storage device of the plasma system 104. It should be noted that the second threshold is a power threshold. The second threshold is of a different variable than that of the first threshold. For example, the second threshold is a power value and the first threshold is an RF voltage value or an ion energy value.

Upon determining that the first variable exceeds the second threshold, in an operation 126, an instruction is provided to change power of the RF signal 154 (FIG. 2). For example, upon determining that the first variable exceeds the second threshold, in an operation 126, an instruction is provided to reduce power of the RF signal 154. As an illustration, the processor of the host system 180 provides an instruction to the DSP 166 (FIG. 2) to reduce power from the parameter value Px1, e.g. a power value Px1, etc., to a power value at which the first variable does not exceed the second threshold. Upon receiving an instruction to reduce power, the DSP 166 decreases the power value Px1 to a power value "Px1−1" lower than the power value Px1 and provides the lowered power value to the parameter control 168 (FIG. 1). In some embodiments, the processor of the host system 180 performs the task of decreasing the power value Px1 to the lowered power value "Px1−1". The parameter control 168 generates a drive power value based on the lowered power value "Px1−1" in a manner similar to that described above of generating a drive power value from the power value Px1. The parameter control 168 provides the drive power value generated based on the received power value "Px1−1" to the DAS 172. The DAS 172 generates an RF signal based on the drive power value that is based on the lowered power value "Px1−1" in a similar manner to that described above for generating an RF signal from a drive power value that is based on the power value Px1 and provides an RF signal via the impedance matching network 112 (FIG. 2) to the lower electrode of the ESC 146 (FIG. 2).

The operations 106, 108, 124, and 126 are iteratively repeated until the power value Px1 is reduced to a value at which the first variable does not exceed the second threshold. To illustrate, after reducing the power value from Px1 to the power value "Px1−1", the first variable is determined based on an RF voltage that is measured at the communication medium 110 or at the RF transmission line 150. It is determined whether the first variable corresponding to the power value "Px1−1" exceeds the second threshold. Upon determining that the first variable corresponding to the power value "Px1−1" exceeds the second threshold, the power value "Px1−1" is further reduced to a power value "Px1−2" and the operations 106, 108, and 124 are repeated.

It should be noted that in an embodiment, to iteratively determine the power value at which the first variable does not exceed the second threshold, the operation 106 is not repeated. Rather, the operations 108, 124, and 126 are iteratively repeated.

On the other hand, upon determining that the first variable does not exceed the second threshold, in the operation 124, it is determined whether the first variable is less than the second threshold. Upon determining that the first variable is less than the second threshold, in the operation 126, an instruction is provided by the processor of the host system 180 to increase the power value Px1. For example, the processor of the host system 180 provides an instruction to the DSP 166 to increase power from the power value Px1 and the DSP 166 increases the power value Px1 to a power value "Px1+1". In one embodiment, the processor of the host system 180 increases the power value Px1 to the power value "Px1+1" and provides the power value "Px1+1" to the DSP 166.

The DSP 166 provides the power value "Px1+1" to the parameter control 168. The parameter control 168 generates a drive power value based on the power value "Px1+1" in a manner similar to that described above of generating the drive parameter value from the parameter value Px1. The parameter control 168 provides the drive power value to the DAS 172. Upon receiving the drive power value the DAS 172 generates an RF signal based on the drive power value in a manner similar to that described above of generating an RF signal from a drive power value that is based on parameter power value Px1 and provides an RF signal via the impedance matching network 112 (FIG. 2) to the lower electrode of the ESC 146 (FIG. 2).

The operations 106, 108, 124, and 126 are iteratively repeated until the power value Px1 is increased to a value at which the first variable is not lower than the second threshold. To illustrate, after increasing the power value from Px1 to the power value "Px1+1", the first variable is determined based on a current at a model node or an RF current that is measured at the communication medium 110 or at the RF transmission line 150. It is determined whether the first variable corresponding to the power value "Px1+1" is less than the second threshold. Upon determining that the first variable corresponding to the power value "Px1+1" is less than the second threshold, the power value "Px1+1" is further increased to a power value "Px1+2" and the operations 106, 108, 124, and 126 are repeated.

It should be noted that in an embodiment, to iteratively determine the power value at which the first variable is not less than the second threshold, the operation 106 is not repeated. Rather, the operations 108, 124, and 126 are repeated. The method 102 is repeated after the operation 126.

On the other hand, upon determining that the first variable matches the second threshold, e.g., is not less than the second threshold and does not exceed the second threshold, etc., in an operation 129, an instruction is provided to maintain the power value Px1. For example, the processor of the host system 180 provides an instruction to the DSP 166 to continue to provide the power value Px1 to the parameter control 168. In one embodiment, the processor of the host system 180 provides the power value Px1 to the DSP 166 and the DSP 166 provides the power value Px1 to the parameter control 168. The method 102 repeats after the operation 129.

It should be noted that the first state is associated with a first use of the plasma system 104 and the second state is associated with a second use of the plasma system 104. For example, when the substrate 119 is to be etched, the operations 108, 124, and 126 or the operations 108, 124, and 129 are performed during the state S1 to facilitate etching of the substrate 119. A decision whether the substrate 119 is to be etched may be provided as an input by a user via an input device of the host system 180. The input device is described below. As another example, when the substrate 119 is to be etched at a rate higher than a rate at which the substrate 119 is to be etched during the state S0, the operations 108, 124, and 126 or the operations 108, 124, and 129 are performed during the state S1 to facilitate etching of the substrate 119 at the higher rate. As another example, when material, e.g., a polymer, a semiconductor, a conductor, etc., is to be deposited on the substrate 119 at a rate lower than a rate at which material is to be deposited on the substrate 119 during the state S0, the operations 116, 118, and 127 or the operations 116, 118, and 131 are performed during the state S0 to facilitate deposition on the substrate 119 at the lower rate.

It should be noted that in some embodiments, a deposition is a passive deposition. For example, passive deposition is a byproduct of etching. To further illustrate, when a substrate, e.g., a semiconductor wafer, etc., is etched, material that is etched away deposits itself onto a surface of the substrate.

In a number of embodiments, a process of depositing is active deposition. For example, a process gas is provided to the plasma chamber 114 to be deposited on a surface of a substrate. As another example, a metal is bombarded with ions to deposit the metal onto a surface of a substrate.

As yet another example, when ion energy within the plasma chamber 114 is to be enhanced compared to that during the state S0, the operations 108, 124, and 126 or the operations 108, 124, and 129 are performed during the state S1.

As another example, when a layer of material is to be deposited on the substrate 119, the operations 116, 118, and 131 or the operations 116, 118, and 127 are performed during the state S0 to facilitate deposition on the substrate 119. As another example, when the substrate 119 is to be etched at the lower rate, the operations 116, 118, and 131 or the operations 116, 118, and 127 are performed during the state S0 to facilitate etching of the substrate 119 at the lower rate. As yet another example, when material is to be deposited on the substrate 119 at the higher rate than a rate at which material is to be deposited on the substrate 119 during the state S1, the operations 116, 118, and 131 or the operations 116, 118, and 127 are performed during the state S0 to facilitate deposition on the substrate 119 at the higher rate. As yet another example, when ion energy within the plasma chamber 114 is to be neutralized, e.g., reduced, etc., the operations 116, 118, and 131 or the operations 116, 118, and 127 are performed during the state S0.

Figure 4:
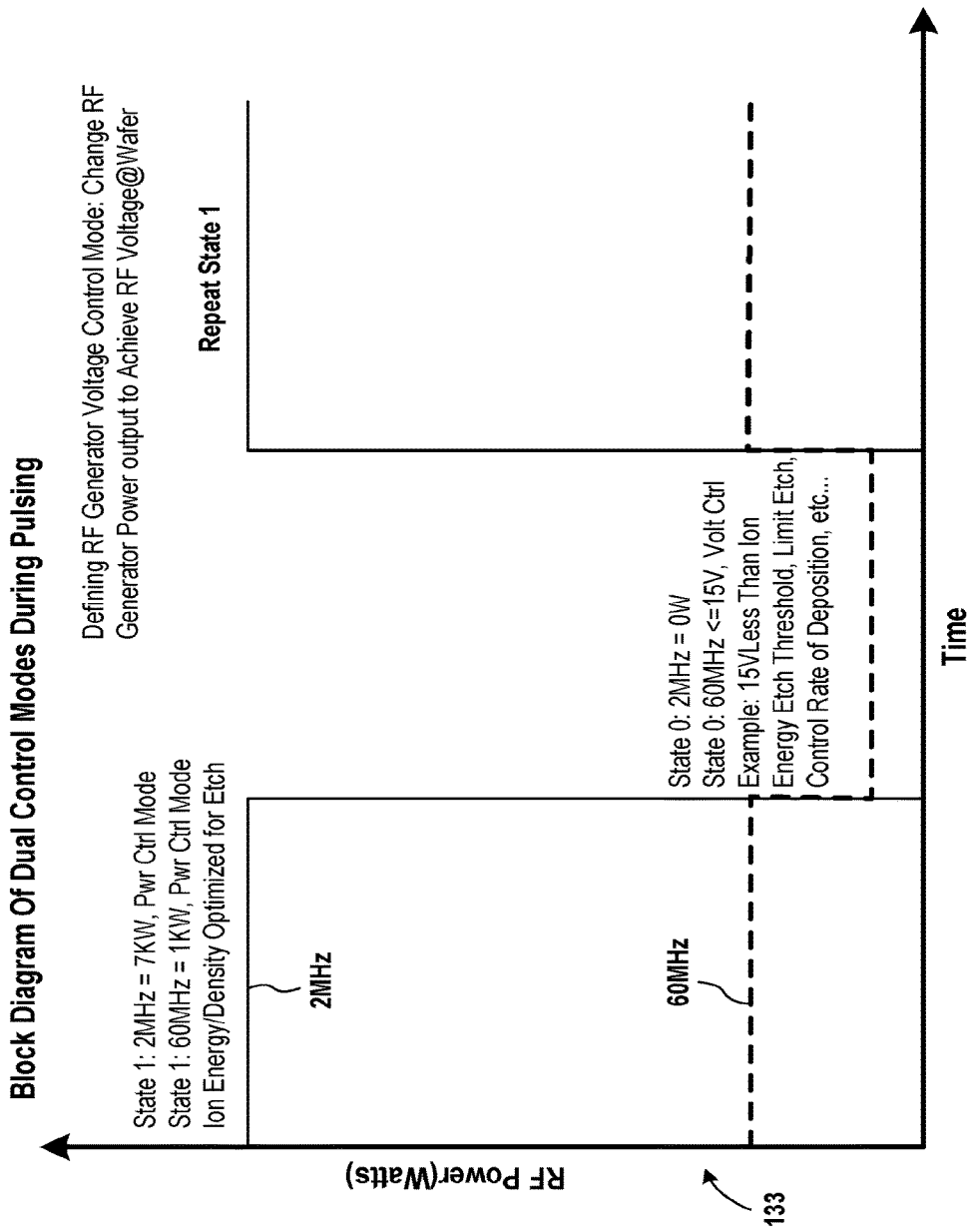
FIG. 4 is a graph that plots radio frequency (RF) power that is provided by 2 MHz and 60 MHz RF generators to an electrode of a plasma chamber versus time, in accordance with an embodiment described in the present disclosure.

FIG. 4 is a graph 133 that plots RF power that is provided by 2 MHz and 60 MHz RF generators to an electrode, e.g., the lower electrode, the upper electrode, etc., of a plasma chamber, e.g., the plasma chamber 114 (FIG. 2), versus time. In a state 1, e.g., the state S1, RF power of an RF signal that is generated by the 2 MHz RF generator is greater than RF power of an RF signal that is generated by the 60 MHz RF generator. For example, RF power of the RF signal generated by the 2 MHz RF generator is 7 kilowatts (kW) and RF power of the RF signal generated by the 60 MHz RF generator is 1 kW. Also, during the state 1, both the RF generators are operated in a power control mode, which is an example of the first variable control mode 155 (FIG. 1A). Moreover, during the state 1, etching is performed on a substrate, e.g., the substrate 119 (FIG. 2), and the method operations 108, 124, and 126 or the operations 108, 124, and 129 are performed during the state S1 to optimize, e.g., increase, etc., ion energy and density of plasma within the plasma chamber 114. The optimization facilitates the etching.

In a state 0, e.g., the state S0, RF power of an RF signal that is generated by the 2 MHz RF generator is less than RF power of an RF signal that is generated by the 60 MHz RF generator. For example, RF power of the RF signal generated by the 2 MHz RF generator is 0 kW and RF power of the RF signal generated by the 60 MHz RF generator is less than 15 watts. Also, during the state 0, both the RF generators are operated in the second variable control mode 157 (FIG. 1A). Moreover, during the state 0, deposition is performed on a substrate, e.g., the substrate 119 (FIG. 2), and the method operations 116, 118, and 131 or the operations 116, 118, and 127 are performed during the state S0 to limit, e.g., neutralize, ion energy and density of plasma within the plasma chamber. The state 1 repeats after the state 0.

Figure 5A:
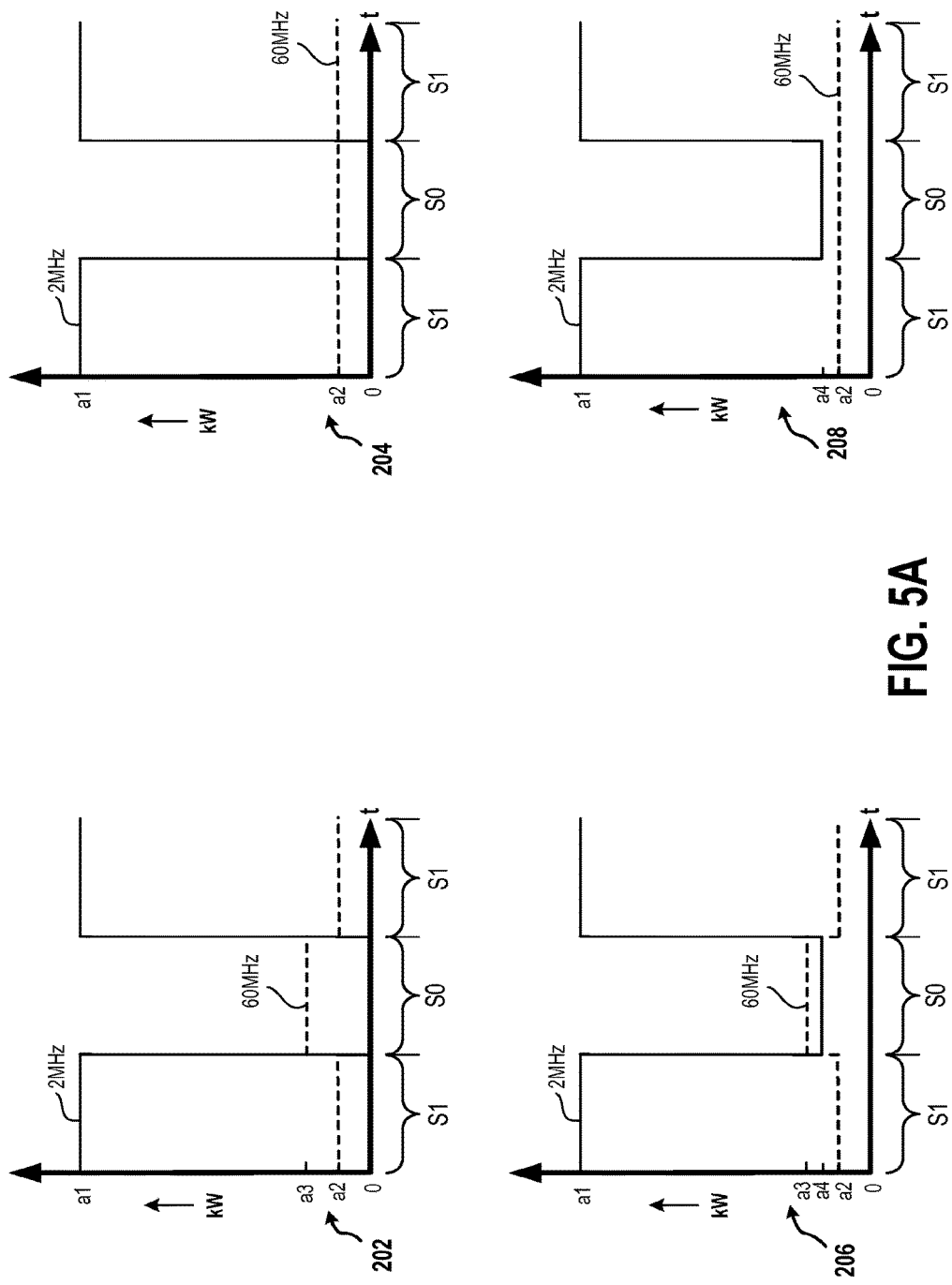
FIG. 5A shows embodiments of graphs to illustrate various power values of a 2 MHz RF signal and a 60 MHz RF signal, in accordance with an embodiment described in the present disclosure.

FIG. 5A shows embodiments of graphs 202, 204, 206, and 208 to illustrate various power values of a 2 MHz RF signal and a 60 MHz RF signal. Each graph 202, 204, 206, and 208 plots power values in kilowatts (kW) as a function of time t. As indicated in graph 202, the 2 MHz power signal, which is a power signal generated by a 2 MHz DAS has a power value of a1 during the state S1 and has a power value of 0 during the state S0. Also, a 60 MHz power signal, which is a power signal supplied by a 60 MHz DAS has a power value of a2 during the state S1 and has a power value of a3 during the state S0.

As indicated in the graph 204, the 60 MHz power signal has the power value a2 during states S1 and S0. Moreover, as indicated in graph 206, the 2 MHz signal has a power value of a4 during the state S0. As indicated in graph 208, the 60 MHz signal has the power value of a2 when the 2 MHz signal has the power value of a4.

Figure 5B:
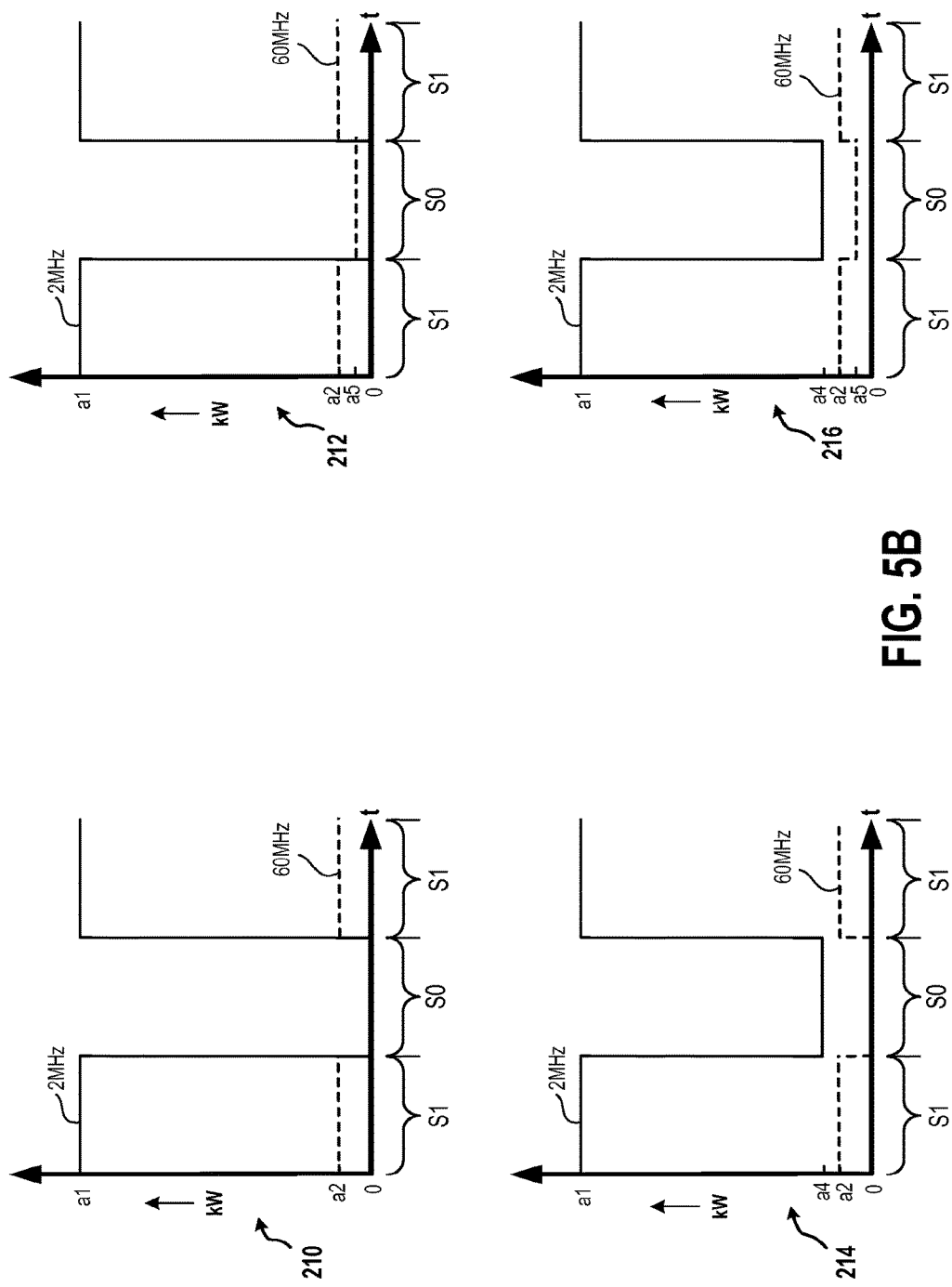
FIG. 5B shows graphs with two RF signals in which both the RF signals have varying values, in accordance with an embodiment described in the present disclosure.

FIG. 5B shows embodiments of graphs 210, 212, 214, and 216. Each graph 210, 212, 214, and 216 plots power values in kilowatts as a function of time t. As shown in graph 210, instead of the 60 MHz signal transitioning from the power value of a2 to the power value of a3 (FIG. 5A), the 60 MHz signal transitions from the power value of a2 to a power value of zero.

Moreover, as shown in graph 212, the 60 MHz signal transitions from the power value of a2 to a power value of a5. As shown in graph 214, the 60 MHz signal has the power value of zero during the state S0 when the 2 MHz signal has a non-zero power value of a4. As shown in graph 216, the 60 MHz power signal has a non-zero power value of a5 during the state S0 when the 2 MHz signal has a non-zero power value of a4.

Figure 6A:
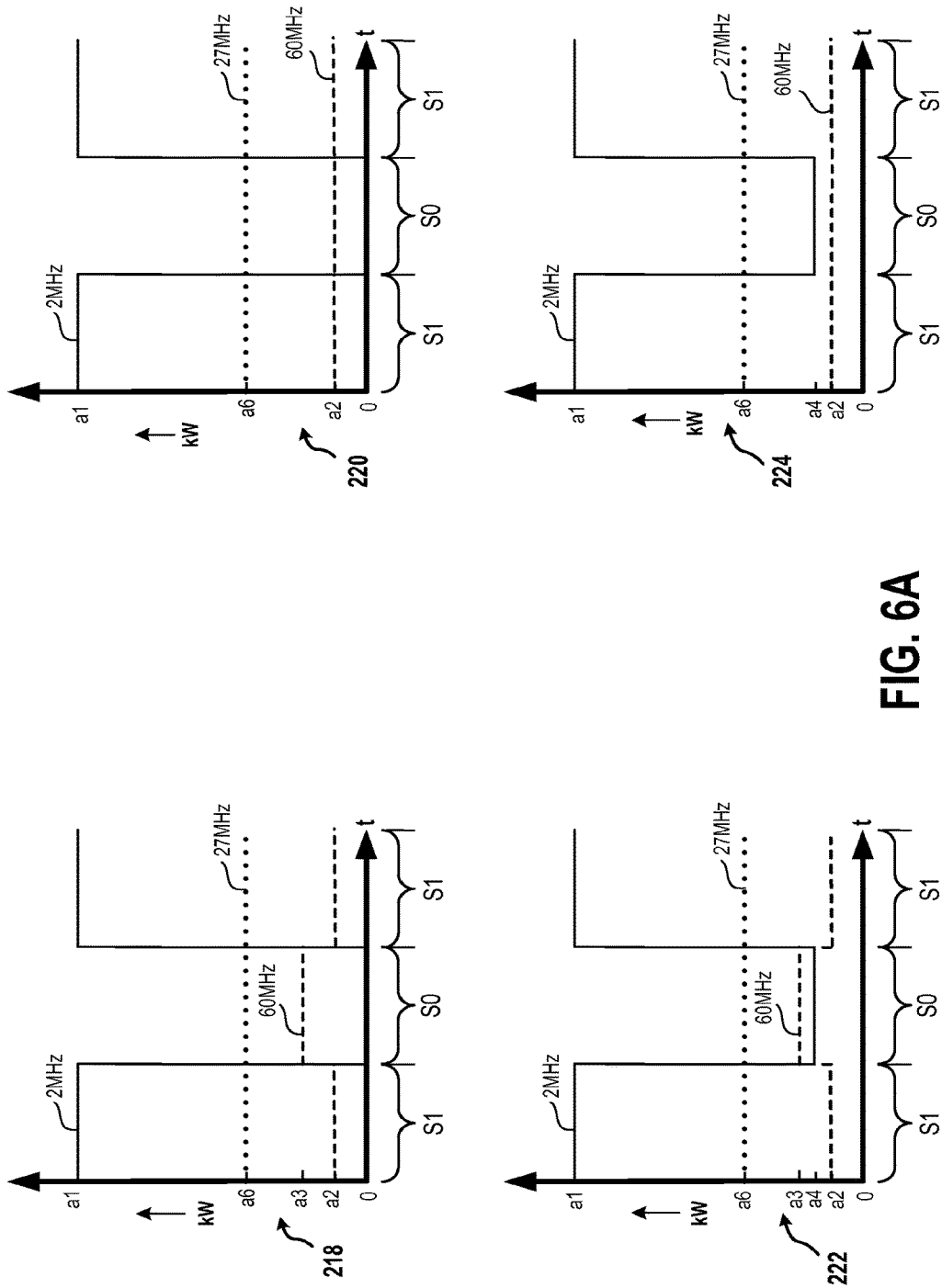
FIG. 6A shows graphs with three RF signals in which one of the RF signals has a constant value and another one of the RF signals has a constant value or varying values, in accordance with an embodiment described in the present disclosure.

FIG. 6A shows embodiments of graphs 218, 220, 222, and 224. Each graph 218, 220, 222, and 224 plots power values in kilowatts as a function of time t. Graph 218 is similar to graph 202 (FIG. 5A), graph 220 is similar to graph 204 (FIG. 5A), graph 220 is similar to graph 206 (FIG. 5A), and graph 222 is similar to graph 208 (FIG. 5A) except that the graphs 218, 220, 222, and 224 include a plot of a 27 MHz signal. The 27 MHz signal is generated from a 27 MHz DAS of a 27 MHz RF generator. The 27 MHz signal is an RF signal having a power value of a6 during both states S1 and S0.

Figure 6B:
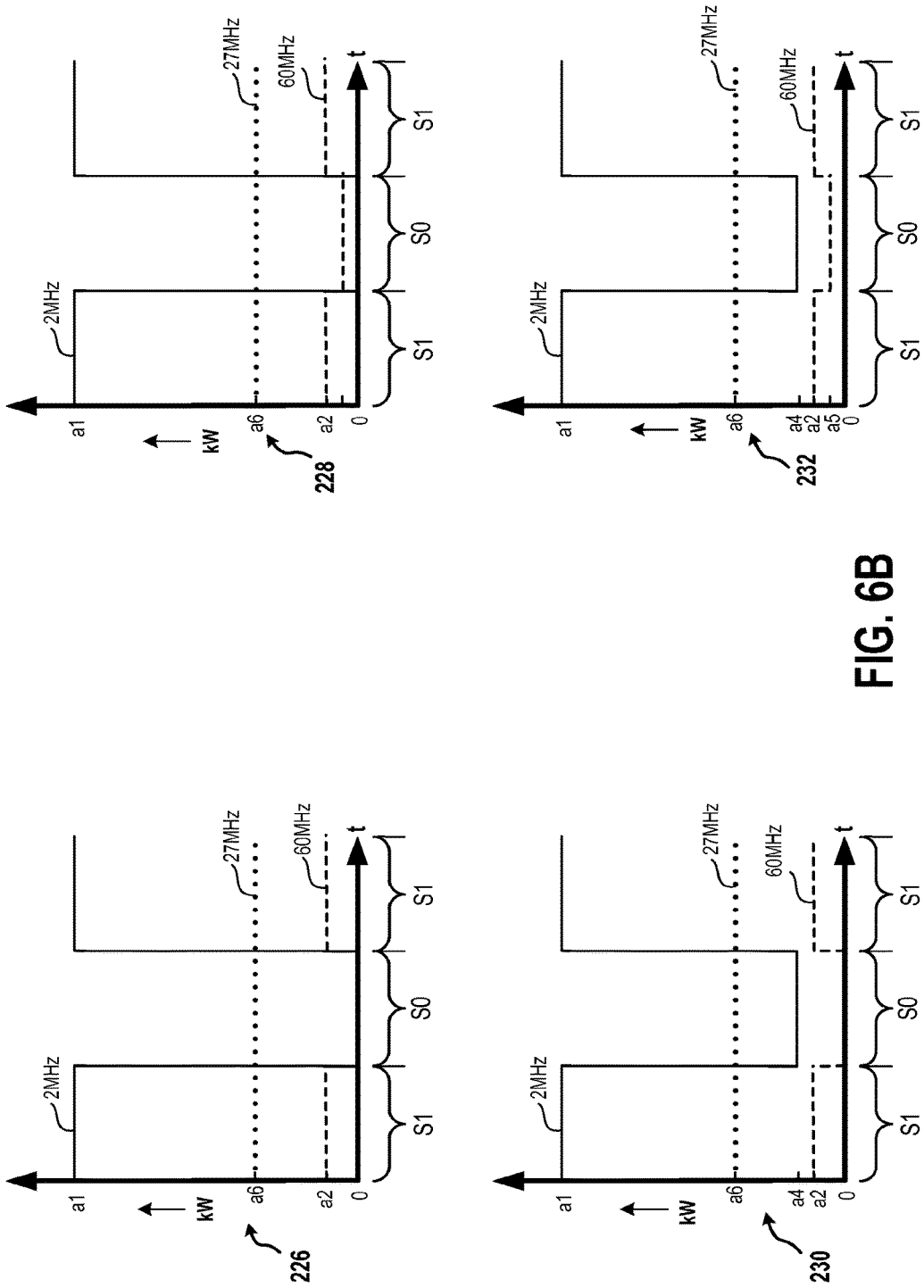
FIG. 6B shows graphs with three RF signals in which one of the RF signals a constant value and the remaining two RF signals have varying values, in accordance with an embodiment described in the present disclosure.

FIG. 6B shows embodiments of graphs 226, 228, 230, and 232. Each graph 226, 228, 230, and 232 plots power values in kilowatts as a function of time t. Graph 226 is similar to graph 210 (FIG. 5B), graph 228 is similar to graph 212 (FIG. 5B), graph 230 is similar to graph 214 (FIG. 5B), and graph 232 is similar to graph 216 (FIG. 5B) except that the graphs 226, 228, 230, and 232 include a plot of a 27 MHz signal that has the power value of a6.

Figure 6C:
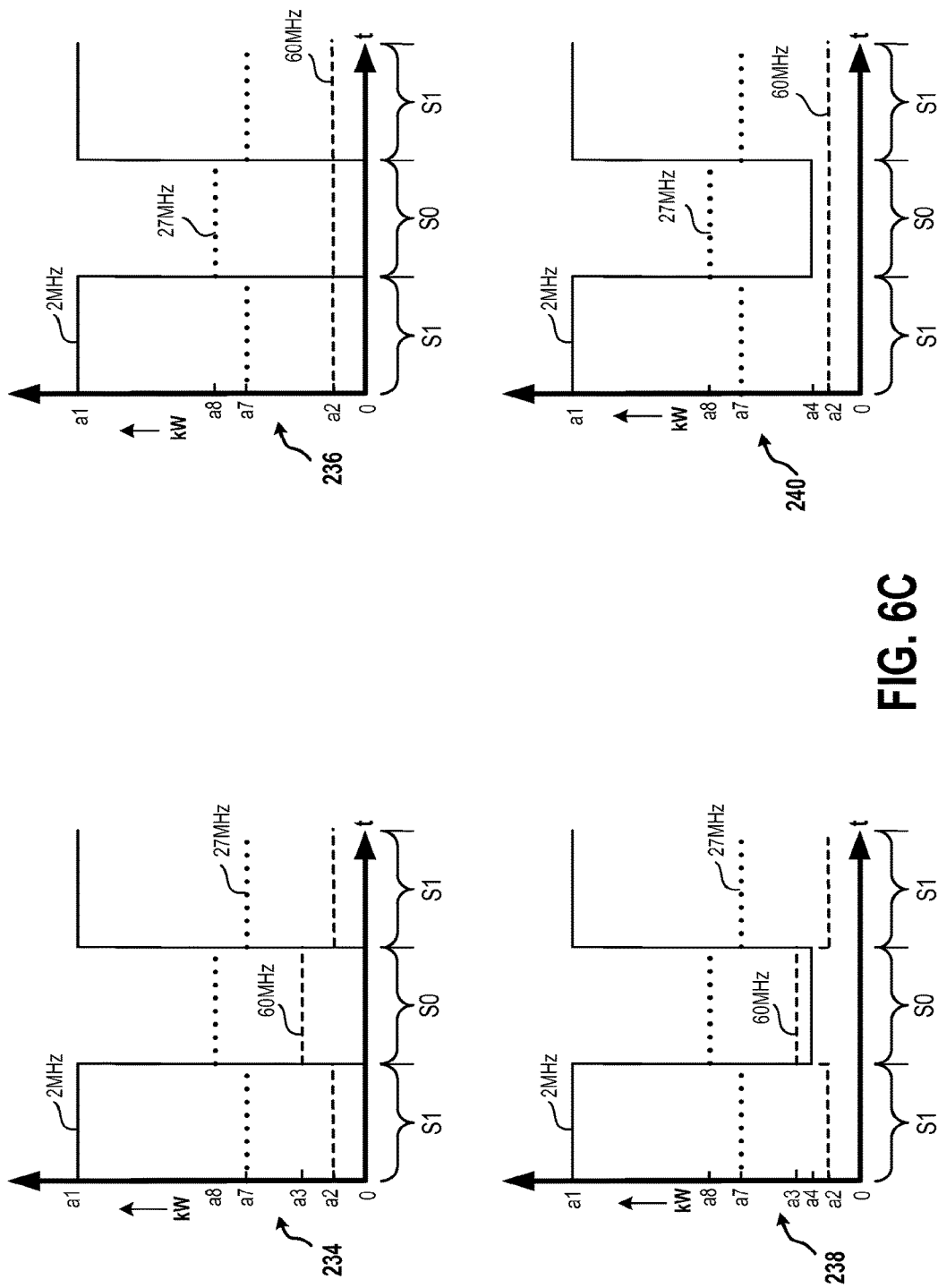
FIG. 6C shows graphs with three RF signals in which one of the RF signals has a constant value or varying values and the remaining two RF signals have varying values, in accordance with an embodiment described in the present disclosure.

FIG. 6C shows embodiments of graphs 234, 236, 238, and 240. Each graph 234, 236, 238, and 240 plots power values in kilowatts as a function of time t. Graph 234 is similar to graph 202 (FIG. 5A), graph 236 is similar to graph 204 (FIG. 5A), graph 238 is similar to graph 206 (FIG. 5A), and graph 240 is similar to graph 208 (FIG. 5A) except that the graphs 234, 236, 238, and 240 include a plot of a 27 MHz signal. The 27 MHz signal transitions from having a power value of a7 during the state S1 to having a power value of a8 during the state S0. The power value a7 is less than the power value a8.

Figure 6D:
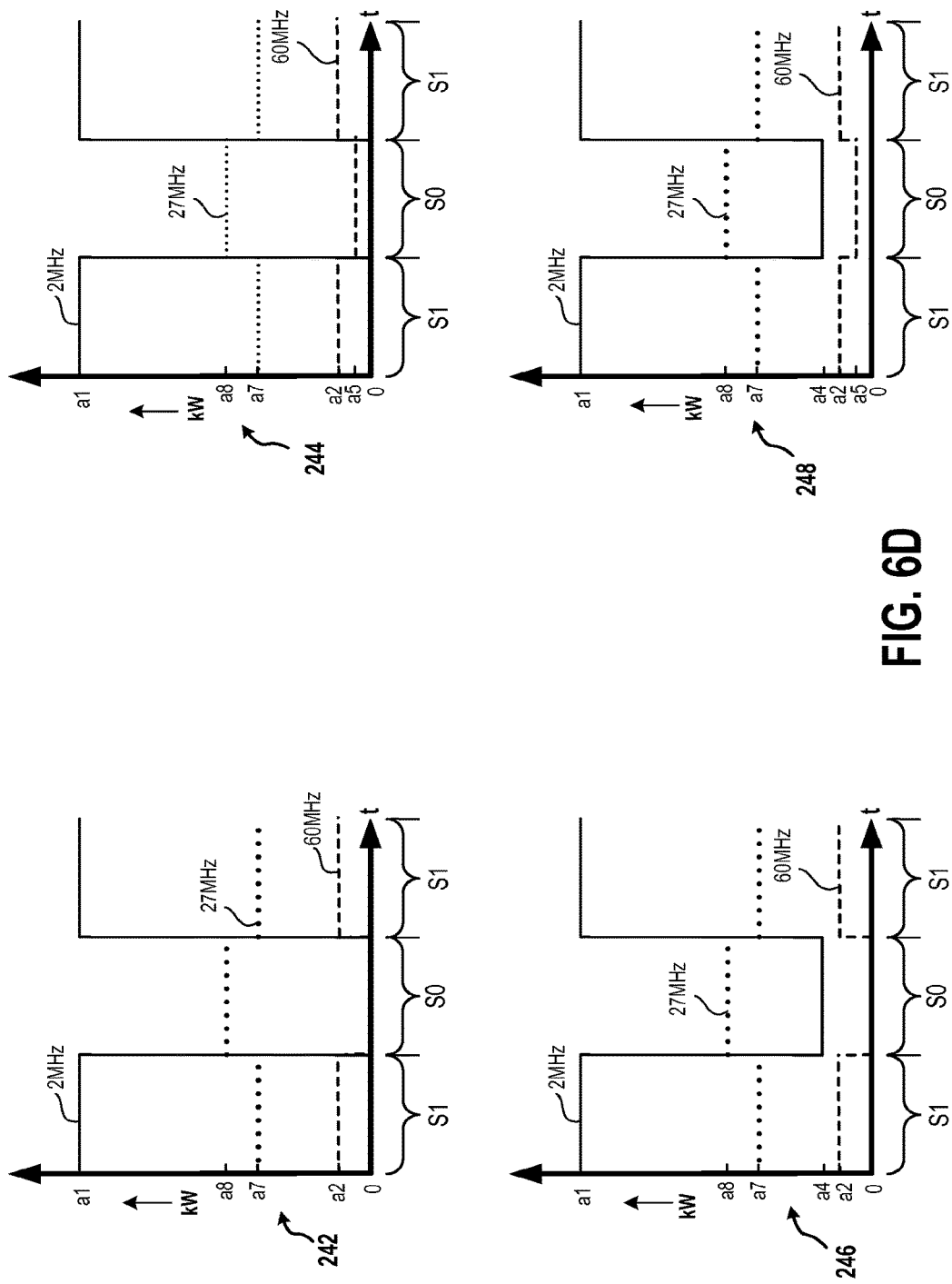
FIG. 6D shows graphs with all three RF signals have varying values, in accordance with an embodiment described in the present disclosure.

FIG. 6D shows embodiments of graphs 242, 244, 246, and 248. Each graph 242, 244, 246, and 248 plots power values in kilowatts as a function of time t. Graph 242 is similar to graph 210 (FIG. 5B), graph 244 is similar to graph 212 (FIG. 5B), graph 246 is similar to graph 214 (FIG. 5B), and graph 248 is similar to graph 216 (FIG. 5B) except that the graphs 242, 244, 246, and 248 include a plot of a 27 MHz signal that has the power values of a7 and a8.

Figure 6E:
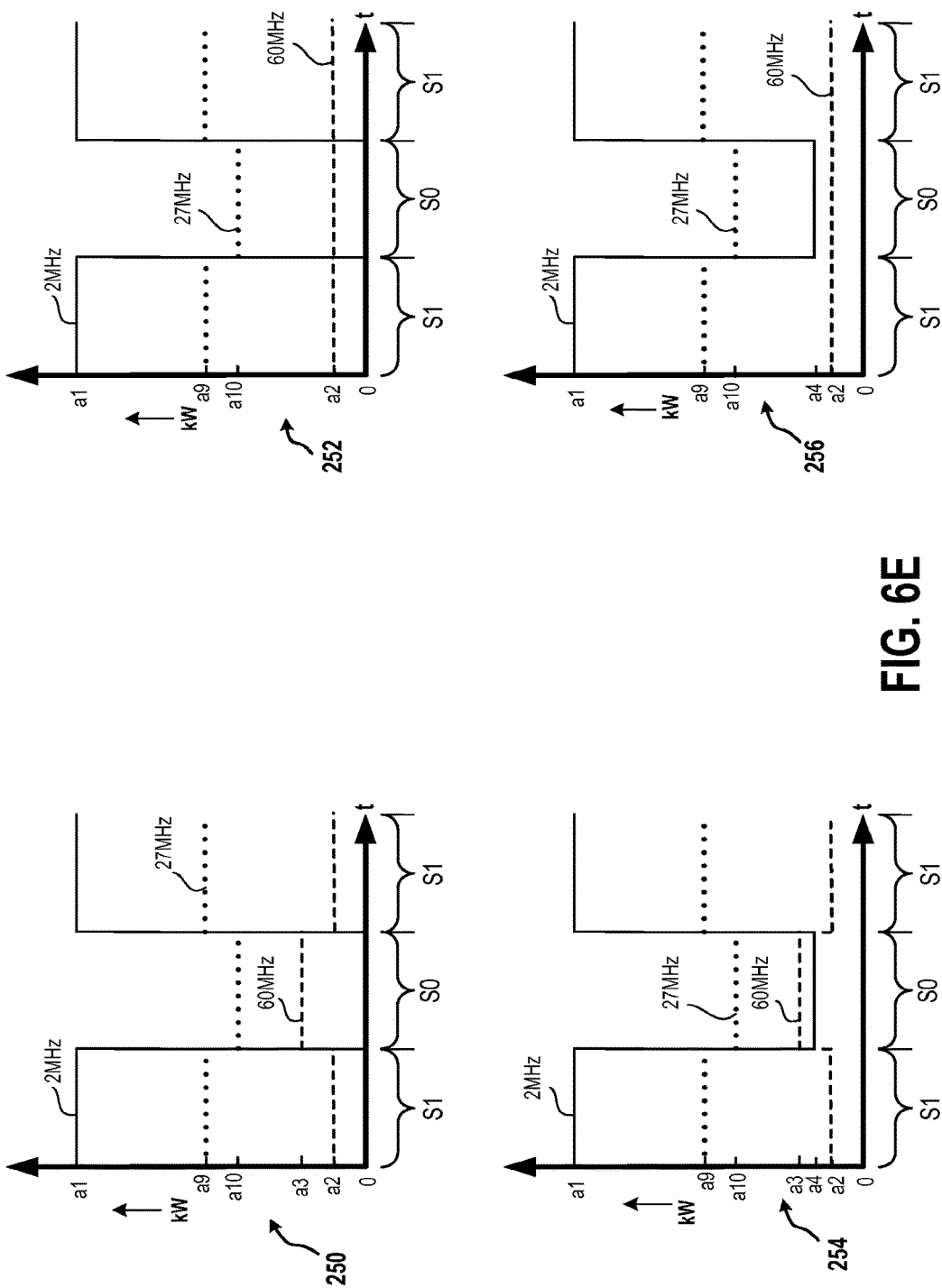
FIG. 6E shows graphs with three RF signals in which one of the RF signals has a constant value or varying values and the remaining RF signals have varying values, in accordance with an embodiment described in the present disclosure.

FIG. 6E shows embodiments of graphs 250, 252, 254, and 256. Each graph 250, 252, 254, and 256 plots power values in kilowatts as a function of time t. Graph 250 is similar to graph 202 (FIG. 5A), graph 252 is similar to graph 204 (FIG. 5A), graph 254 is similar to graph 206 (FIG. 5A), and graph 256 is similar to graph 208 (FIG. 5A) except that the graphs 250, 252, 254, and 256 include a plot of a 27 MHz signal. The 27 MHz signal transitions from having a power value of a9 during the state S1 to having a power value of a10 during the state S0. The power value a9 is greater than the power value a10.

Figure 6F:
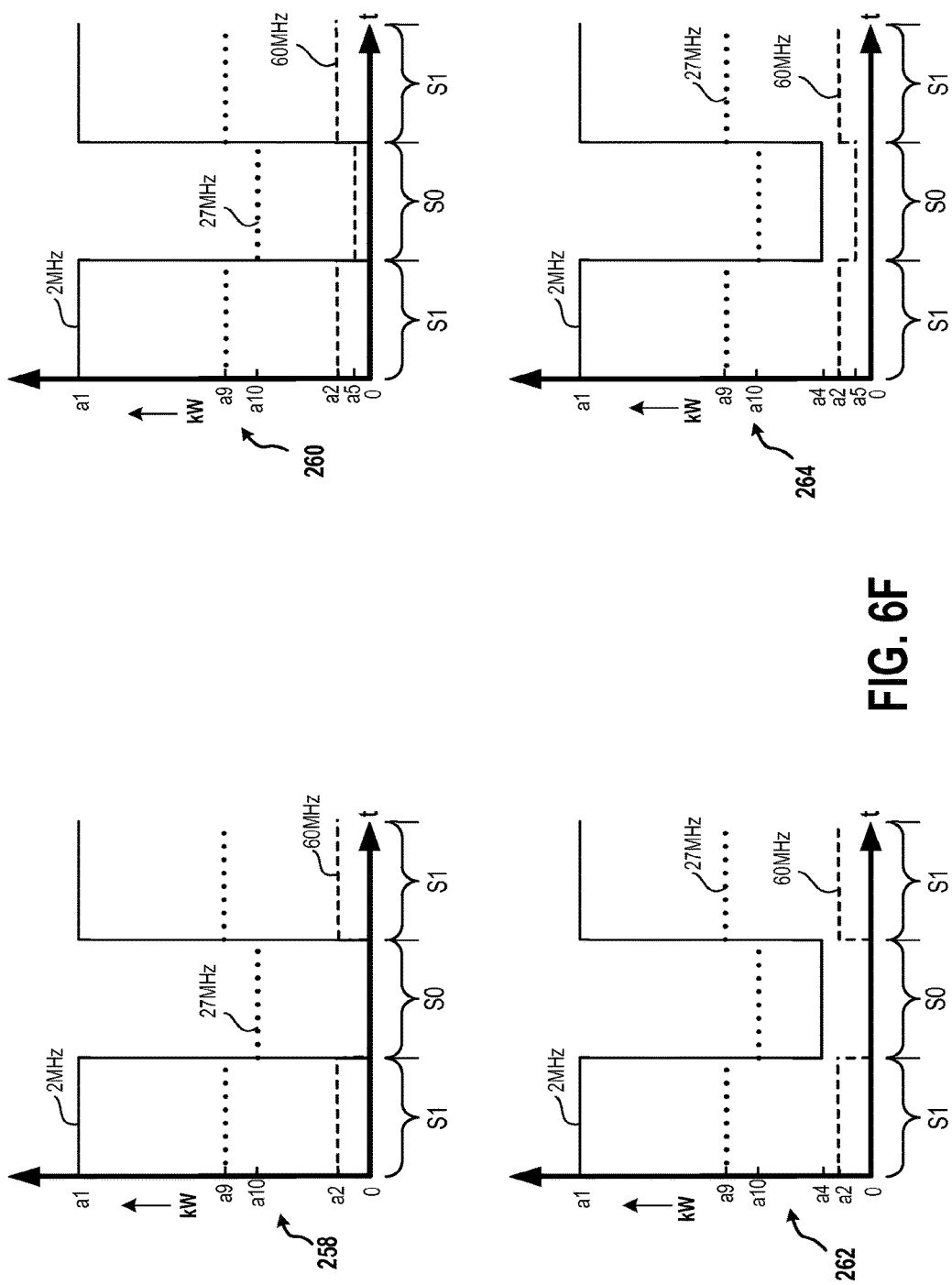
FIG. 6F shows graphs with all three RF signals have varying values, in accordance with an embodiment described in the present disclosure.

FIG. 6F shows embodiments of graphs 258, 260, 262, and 264. Each graph 258, 260, 262, and 264 plots power values in kilowatts as a function of time t. Graph 258 is similar to graph 210 (FIG. 5B), graph 260 is similar to graph 212 (FIG. 5B), graph 262 is similar to graph 214 (FIG. 5B), and graph 264 is similar to graph 216 (FIG. 5B) except that the graphs 258, 260, 262, and 264 include a plot of a 27 MHz signal that has the power values of a9 and a10.

It should be noted that in the graphs 202, 204, 206, 208, 210, 212, 214, 216, 218, 220, 222, 224, 226, 228, 230, 232, 234, 236, 238, 240, 242, 244, 246, 248, 250, 252, 254, 256, 258, 260, 262, and 264 shown above, the 2 MHz signal is shown as a solid line, the 60 MHz signal is shown as a dashed line, and the 27 MHz signal is shown as a dotted line.

In some embodiments, each graph of FIGS. 4, 5A, 5B, 5C, 6A, 6B, 6C, 6D, 6E, and 6F plots root mean square (RMS) values of power of an RF signal as having the state S0 and the state S1. The states S0 and S1 recur periodically. Each state is associated with a combination of an RMS value of power of an RF generator, a frequency of the RF generator, a current of the RF generator, a voltage of the RF generator, a pressure within a plasma chamber 114, a gap between the upper electrode 194 and the ESC 146 of the plasma chamber 114, and a rate of flow of one or more process gases within the plasma chamber 114. For example, a first combination of frequency, an RMS value of power, pressure, gap, and a rate of flow of chemistry is used during the state S0 and a second combination of frequency, an RMS value of power, pressure, gap, and a rate of flow of chemistry is used during the state S1. In some embodiments, a chemistry includes one or more process gases. To further illustrate, in the first combination, a first frequency value, an RMS value of power, pressure, gap, and a rate of flow of chemistry are used and in the second combination, a second frequency value, and the same RMS value of power, the same amount of pressure, the same amount of gap, and the same rate of flow of the same chemistry as in the first combination are used. As another illustration, in the first combination, the first frequency value, a first RMS power value, pressure, gap, and a rate of flow of chemistry are used and in the second combination, the second frequency value, a second RMS power value, and the same amount of pressure, the same amount of gap, and the same rate of flow of the same chemistry as that in the first combination are used. In some embodiments, pressure within the plasma chamber 114 is wafer area pressure (WAP).

In some embodiments, instead of RMS values of power of an RF signal, any other statistical measure, e.g., mean values, peak-to-peak amplitude, zero-to-peak amplitude, median values, etc., of power is used in a graph and plotted versus time.

Figure 7:
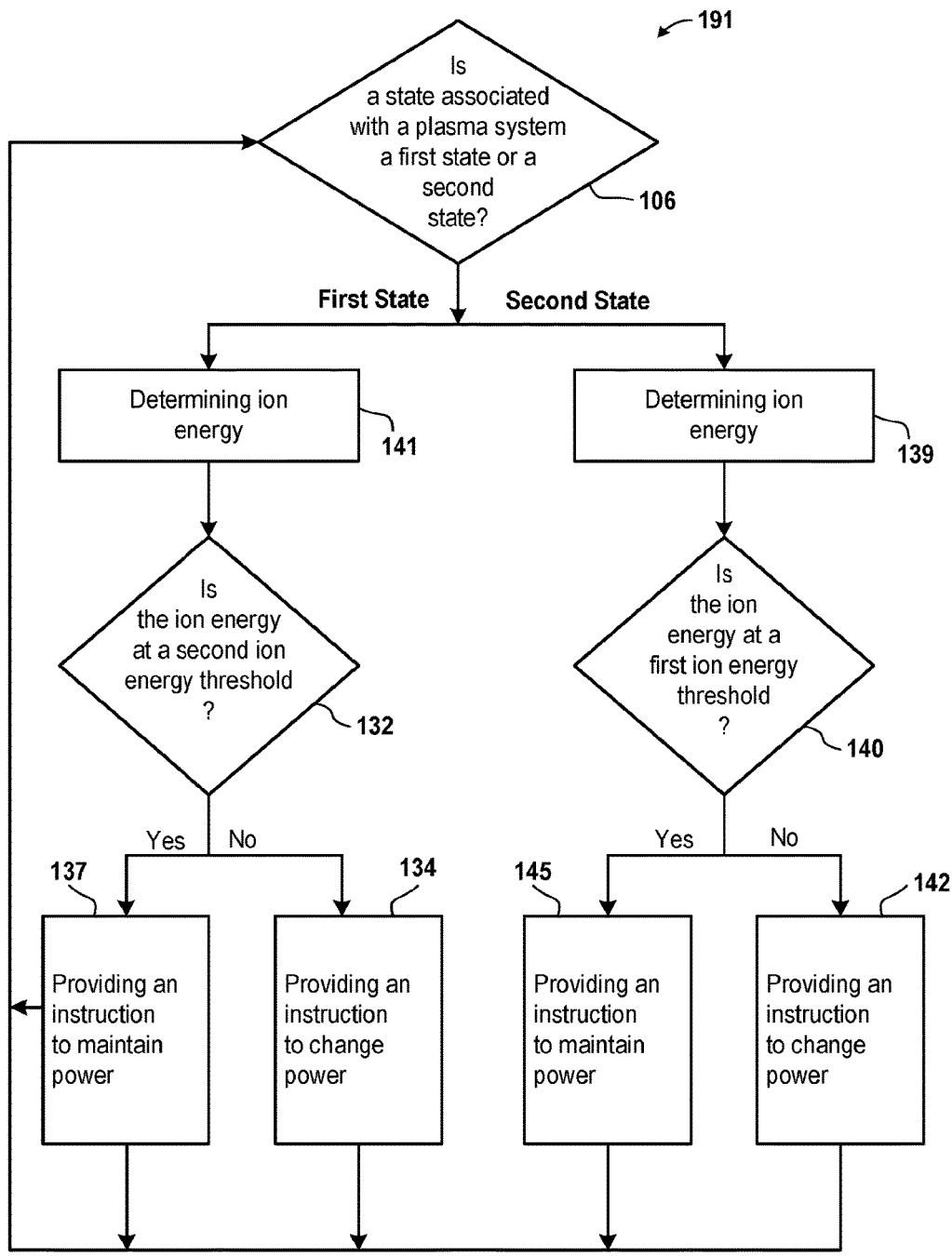
FIG. 7 is a flowchart of an embodiment of a method for using ion energy for states associated with the plasma system of FIG. 2, in accordance with an embodiment described in the present disclosure.

FIG. 7 is a flowchart of an embodiment of a method 191 for using ion energy for states associated with the plasma system 104 (FIG. 2). The method 191 is described with reference to FIG. 2. The method 191 is executed by one or more processors, e.g., a processor of the host system 180 (FIG. 2), or the DSP 166, or the DSP 178 (FIG. 2), or a combination of the processor of the host system 180 and the DSP 166, or a combination of the processor of the host system 180 and the DSP 178, etc.

The operation 106 is performed. Upon determining that the state associated with the plasma system 104 is the first state, in an operation 131, ion energy within the plasma chamber 114 is determined. The ion energy within the plasma chamber 114 during the first state is determined in a manner similar to determining ion energy within the plasma chamber 114 during the second state. For example, when the RF signal 154 (FIG. 2) is transferred to the plasma chamber 114, the voltage and current probe 152 (FIG. 2) measures the complex voltage and current at the communication medium 110 and provides the measured complex voltage and current to a processor of the host system 180 (FIG. 2) via the DSP 166 (FIG. 2). The complex voltage and current is propagated via one or more models of one or more parts of the plasma system 104 to calculate a complex voltage and current at a model node, e.g., an output of the one or more models, an input of a model, within a model etc. Based on the complex voltage and current at the model node, the processor of the host system 180 determines an ion energy.

On the other hand, upon determining that the state associated with the plasma system 104 is the second state, in an operation 139, ion energy is determined. The ion energy is determined in the operation 139 in a manner similar to determining the second variable during the operation 116 (FIG. 3) except that the second variable is ion energy.

Moreover, in an operation 140, it is determined whether the ion energy determined during the operation 139 meets a first ion energy threshold. For example, it is determined whether the ion energy determined during the operation 139 exceeds the first ion energy threshold. The operation 140 is similar to the operation 118 (FIG. 3) except that the second variable is ion energy and the first threshold of the operation 118 is the first ion energy threshold. For example, it is determined whether the ion energy determined during the operation 139 exceeds the first ion energy threshold. The first ion energy threshold is stored within a storage device, e.g., a storage device of the host system 180 or any other storage device of the plasma system 104.

Upon determining that the ion energy determined during the operation 139 exceeds the first ion energy threshold, in an operation 142, an instruction is provided to change power of the RF signal 156 (FIG. 2). For example, upon determining that the ion energy determined during the operation 139 exceeds the first ion energy threshold, in the operation 142, an instruction is provided to reduce power of the RF signal 156. The operation 142 is similar to the operation 127 (FIG. 3) except that the operation 142 is performed with respect to ion energy and the first ion energy threshold. For example, the processor of the host system 180 provides an instruction to the DSP 166 (FIG. 2) to reduce power from the power value Px0 to a power value at which the ion energy determined during the operation 139 does not exceed the first ion energy threshold. As another example, the operations 106, 139, 140, and 142 are iteratively repeated until the power value Px0 is reduced to a value at which the ion energy determined during the operation 139 does not exceed the first ion energy threshold. As a further example, to iteratively determine the power value at which the ion energy determined during the operation 139 does not exceed the first ion energy threshold, the operation 106 is not repeated. Rather, the operations 139, 140, and 142 are iteratively repeated.

On the other hand, upon determining that the ion energy determined during the operation 139 does not exceed the first ion energy threshold, in the operation 140, it is determined whether the ion energy determined during the operation 139 is less than the first ion energy threshold. Upon determining that the ion energy determined during the operation 139 is less than the first ion energy threshold, in the operation 142, an instruction is provided by the processor of the host system 180 to increase the power value Px0. For example, the processor of the host system 180 provides an instruction to the DSP 166 to increase power from the power value Px0 and the DSP 166 increases the power value Px0 to the power value "Px0+1". As another example, the operations 106, 139, 140, and 142 are iteratively repeated until the power value Px0 is increased to a value at which the ion energy determined during the operation 139 is not lower than the first ion energy threshold. As a further example, to iteratively determine the power value at which the ion energy determined during the operation 139 is not less than the first ion energy threshold, the operation 106 is not repeated. Rather, the operations 139, 140, and 142 are repeated. The method 191 is repeated after the operation 142.

On the other hand, upon determining that the ion energy determined during the operation 139 is not less than the first ion energy threshold and does not exceed the first ion energy threshold, in an operation 145, an instruction is provided to maintain the power value Px0 in a manner similar to that described above with reference to the operation 131 (FIG. 3). The method 191 repeats after the operation 145.

In an operation 132, it is determined whether the ion energy determined during the operation 141 meets a second ion energy threshold. For example, it is determined whether the ion energy determined during the operation 141 exceeds the second ion energy threshold. The second ion energy threshold is stored within a storage device, e.g., a storage device of the host system 180 or any other storage device of the plasma system 104.

Upon determining that the ion energy determined during the operation 141 exceeds the second ion energy threshold, in an operation 134, an instruction is provided to change power of the RF signal 154 (FIG. 2). For example, upon determining that the ion energy determined during the operation 141 exceeds the second ion energy threshold, in the operation 134, an instruction is provided to reduce power of the RF signal 154. The operation 134 is similar to the operation 126 (FIG. 3) except that the operation 134 is performed with respect to the second ion energy threshold and is performed with respect to the determined ion energy of operation 141. For example, processor of the host system 180 provides an instruction to the DSP 166 (FIG. 2) to reduce power from the power value Px1 to a power value at which the ion energy determined during the operation 141 does not exceed the second ion energy threshold. As another example, the operations 106, 141, 132, and 134 are iteratively repeated until the power value Px1 is reduced to a value at which the ion energy determined during the operation 141 does not exceed the second ion energy threshold. As a further example, to iteratively determine the power value at which the ion energy determined during the operation 141 does not exceed the second ion energy threshold, the operation 106 is not repeated. Rather, the operations 141, 132, and 134 are iteratively repeated.

On the other hand, upon determining that the ion energy determined during the operation 141 does not exceed the second ion energy threshold, in the operation 132, it is determined whether the ion energy determined during the operation 141 is less than the second ion energy threshold. Upon determining that the ion energy determined during the operation 141 is less than the second ion energy threshold, in the operation 134, an instruction is provided by the processor of the host system 180 to increase the power value Px1. The operation 134 is similar to the operation 126 (FIG. 3) except that the operation 134 is performed with respect to the second ion energy threshold and with respect to the determined ion energy of operation 141. For example, the processor of the host system 180 provides an instruction to the DSP 166 to increase power from the power value Px1 and the DSP 166 increases the power value Px1 to the power value "Px1+1". As another example, the operations 106, 141, 132, and 134 are iteratively repeated until the power value Px1 is increased to a value at which the ion energy determined during the operation 141 is not lower than the second ion energy threshold. As a further example, to iteratively determine the power value at which the ion energy determined during the operation 141 is not less than the second ion energy threshold, the operation 106 is not repeated. Rather, the operations 141, 132, and 134 are repeated. The method 191 is repeated after the operation 134.

On the other hand, upon determining that the ion energy determined during the operation 141 is not less than the second ion energy threshold and does not exceed the second ion energy threshold, in an operation 137, an instruction is provided to maintain the power value Px1. For example, the processor of the host system 180 provides an instruction to the DSP 166 to continue to provide the power value Px1 to the parameter control 168. In one embodiment, the processor of the host system 180 provides the power value Px1 to the DSP 166 and the DSP 166 provides the power value Px1 to the parameter control 168. The method 191 repeats after the operation 137.

The use of ion energy in various embodiments of the present disclosure results in a low measured time between failures (MTBF).

Figure 8:
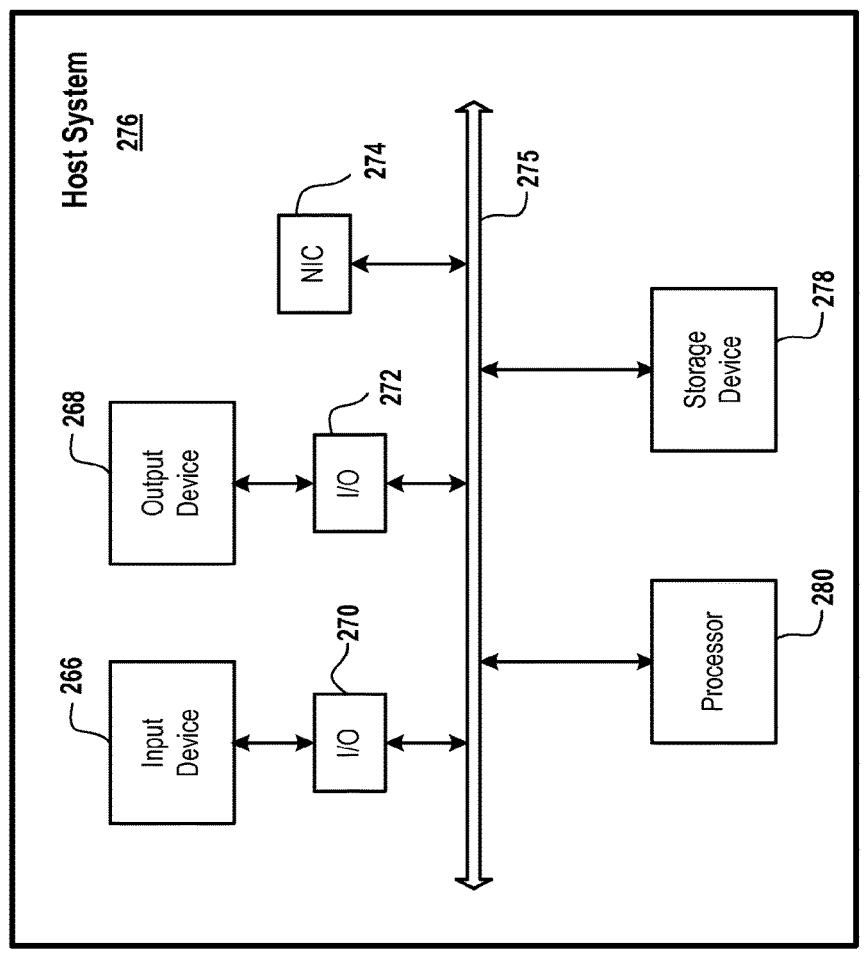
FIG. 8 is a block diagram of an embodiment of a host system that is used to execute the methods of FIGS. 3 and 7, in accordance with one embodiment described in the present disclosure.

FIG. 8 is a block diagram of an embodiment of the host system 276, which is an example of the host system 180 (FIG. 1). The host system 276 includes a processor 280, a storage device 278, an input device 266, an output device 268, an input/output (I/O) interface 270, an I/O interface 272, a network interface controller (NIC) 274, and a bus 275. The processor 280, the storage device 278, the input device 266, the output device 268, the I/O interface 270, the I/O interface 272, and the NIC 274 are coupled with each other via the bus 275. Examples of the input device 266 include a mouse, a keyboard, a stylus, etc. Examples of the output device 268 include a display, a speaker, or a combination thereof. The display may be a liquid crystal display, a light emitting diode display, a cathode ray tube, a plasma display, etc. Examples of the NIC 274 include a network interface card, a network adapter, etc.

Examples of an I/O interface include an interface that provides compatibility between pieces of hardware coupled to the interface. For example, the I/O interface 270 converts a signal received from the input device 266 into a form, amplitude, and/or speed compatible with the bus 275. As another example, the I/O interface 272 converts a signal received from the bus 275 into a form, amplitude, and/or speed compatible with the output device 268.

It should be noted that although the above-described embodiments relate to providing an RF signal to the lower electrode of the ESC 146 (FIG. 2) and grounding the upper electrode 194 (FIG. 2), in several embodiments, the RF signal is provided to the upper electrode 194 while the lower electrode of the ESC 146 is grounded.

It should further be noted that although the above-described embodiments are described with reference to parallel plate plasma chamber, in one embodiment, the above-described embodiments apply to other types of plasma chambers, e.g., a plasma chamber including an inductively coupled plasma (ICP) reactor, a plasma chamber including an electron-cyclotron resonance (ECR) reactor, etc. For example, the x and/or y MHz RF generator (FIG. 2) is coupled to an inductor within the ICP plasma chamber.

Moreover, although the method operations in the flowcharts of FIGS. 3 and 7 above were described in a specific order, it should be understood that other housekeeping operations may be performed in between operations, or operations may be adjusted so that they occur at slightly different times, or may be distributed in a system which allows the occurrence of the processing operations at various intervals associated with the processing, or may be performed in a different order, as long as the processing of the overlay operations are performed in the desired way.

Embodiments described herein may be practiced with various computer system configurations including hand-held devices, microprocessor systems, microprocessor-based or programmable consumer electronics, minicomputers, mainframe computers and the like. The embodiments can also be practiced in distributed computing environments where tasks are performed by remote processing devices that are linked through a network.

With the above embodiments in mind, it should be understood that the embodiments can employ various computer-implemented operations involving data stored in computer systems. These operations are those requiring physical manipulation of physical quantities. Any of the operations described herein that form part of the embodiments are useful machine operations. The embodiments also relates to a device or an apparatus for performing these operations. The apparatus may be specially constructed for a special purpose computer. When defined as a special purpose computer, the computer can also perform other processing, program execution or routines that are not part of the special purpose, while still being capable of operating for the special purpose. Alternatively, the operations may be processed by a computer selectively activated or configured by one or more computer programs stored in the computer memory, cache, or obtained over a network. When data is obtained over a network, the data may be processed by other computers on the network, e.g., a cloud of computing resources.

One or more embodiments can also be fabricated as computer-readable code on a computer-readable medium. The computer-readable medium is any storage device that can store data, which can be thereafter be read by a computer system. Examples of the computer-readable medium include hard drives, network attached storage (NAS), ROM, RAM, compact disc-ROMs (CD-ROMs), CD-recordables (CD-Rs), CD-rewritables (CD-RWs), magnetic tapes and other optical and non-optical data storage devices. The computer-readable medium can include computer-readable tangible medium distributed over a network-coupled computer system so that the computer-readable code is stored and executed in a distributed fashion.

It should be noted that one or more features from any embodiment may be combined with one or more features of any other embodiment without departing from the scope described in various embodiments described in the present disclosure.

In some embodiments, instead of an ESC, a magnetic chuck may be used.

Although the foregoing embodiments have been described in some detail for purposes of clarity of understanding, it will be apparent that certain changes and modifications can be practiced within the scope of the appended claims. Accordingly, the present embodiments are to be considered as illustrative and not restrictive, and the embodiments are not to be limited to the details given herein, but may be modified within the scope and equivalents of the appended claims.

The invention claimed is:

1. A method for using different variables based on a state associated with a plasma system, comprising:
   determining whether the state associated with the plasma system is a first state or a second state;
   determining a first variable upon determining that the state is the first state, the first variable determined based on a measurement at a communication medium, the communication medium located between a radio frequency (RF) generator and a plasma chamber of the plasma system;
   determining a second variable upon determining that the state is the second state, the second variable determined based on a measurement at the communication medium;
   determining whether the second variable exceeds a first threshold;
   providing an instruction to reduce power supplied to the plasma chamber upon determining that the second variable exceeds the first threshold; and
   providing an instruction to increase power supplied to the plasma chamber upon determining that the second variable is below the first threshold,
   wherein the method is executed by one or more processors.

2. The method of claim 1, wherein the first variable is power, wherein the second variable is ion energy, and wherein the first threshold is a threshold ion energy.

3. The method of claim 2, wherein the ion energy is a function of an RF voltage and a bias potential.

4. The method of claim 1, wherein the first variable is power and the second variable is an RF voltage.

5. The method of claim 1, further comprising:
   determining whether the first variable exceeds a second threshold;
   providing an instruction to reduce the power supplied to the plasma chamber upon determining that the first variable exceeds the second threshold; and
   providing an instruction to increase the power supplied to the plasma chamber upon determining that the first variable is below the second threshold.

6. The method of claim 5, wherein the second threshold is a power threshold.

7. The method of claim 5, wherein providing the instruction to reduce the power upon determining that the first variable exceeds the second threshold comprises providing the instruction to reduce the power to achieve the second threshold.

8. The method of claim 5, wherein providing the instruction to increase the power comprises providing the instruction to increase the power to achieve the second threshold.

9. The method of claim 1, wherein the first state is associated with a first use of the plasma system and the second state is associated with a second use of the plasma system.

10. The method of claim 9, wherein the first use includes etching a substrate and the second use includes depositing one or more layers on the substrate.

11. The method of claim 9, wherein the first use includes etching a substrate at a higher rate than an etch rate associated with the second use.

12. A method for using ion energy for states associated with a plasma system, comprising:
determining whether the state associated with the plasma system is a first state or a second state;
determining an ion energy associated with a plasma chamber upon determining that the state is the second state;
determining whether the ion energy matches a first ion energy threshold; and
providing an instruction to change power supplied to the plasma chamber upon determining that the ion energy exceeds the first ion energy threshold,
wherein the method is executed by one or more processors.

13. The method of claim 12, wherein the ion energy is a function of an RF voltage and a bias potential.

14. The method of claim 12, further comprising:
determining an ion energy associated with the plasma chamber upon determining that the state is the first state;
determining whether the ion energy for the first state matches a second ion energy threshold; and
providing an instruction to change the power supplied to the plasma chamber upon determining that the ion energy for the first state does not match the second ion energy threshold.

15. The method of claim 14, wherein the first ion energy threshold is associated with a higher etch rate than an etch rate associated with the second ion energy threshold.

16. A plasma system for using different variables based on a state associated with the plasma system, comprising:
a plasma chamber including:
a chuck for supporting a substrate; and
an upper electrode located above the chuck;
an impedance matching circuit coupled to the plasma chamber via a first communication medium;
a radio frequency (RF) generator coupled to the impedance matching circuit via a second communication medium;
a sensor coupled to the first communication medium for generating a first measurement and a second measurement from RF signals transferred via the first communication medium;
a processor coupled to the RF generator, the processor configured to:
determine whether the state associated with the plasma system is a first state or a second state;
determine a first variable upon determining that the state is the first state, the first variable determined based on the first measurement;
determine a second variable upon determining that the state is the second state, the second variable determined based on the second measurement;
determine whether the second variable exceeds a first threshold;
provide an instruction to reduce power supplied to the plasma chamber upon determining that the second variable exceeds the first threshold; and
provide an instruction to increase the power supplied to the plasma chamber upon determining that the second variable is below the first threshold.

17. The plasma system of claim 16, wherein the first variable is power and the second variable is voltage.

18. A plasma system for using different variables based on a state associated with the plasma system, comprising:
a plasma chamber including:
a chuck for supporting a substrate; and
an upper electrode on top of the chuck;
an impedance matching circuit coupled to the plasma chamber via a first communication medium;
a radio frequency (RF) generator coupled to the impedance matching circuit via a second communication medium;
a sensor for generating a first measurement and a second measurement from RF signals transferred via the first communication medium;
a processor coupled to the RF generator, the processor configured to:
determine whether a state associated with the plasma system is a first state or a second state;
determine an ion energy associated with the plasma chamber upon determining that the state is the second state, the ion energy determined based on the first measurement;
determine whether the ion energy exceeds a first ion energy threshold;
provide an instruction to reduce power supplied to the plasma chamber upon determining that the ion energy exceeds the first ion energy threshold; and
provide an instruction to increase the power supplied to the plasma chamber upon determining that the ion energy is below the first ion energy threshold.

19. The plasma system of claim 18, wherein the ion energy is a function of an RF voltage and a bias potential.

20. The plasma system of claim 19, wherein the processor is further configured to:
determine an ion energy associated with the plasma chamber upon determining that the state is the first state;
determine whether the ion energy for the first state exceeds a second ion energy threshold;
provide an instruction to reduce the power supplied to the plasma chamber upon determining that the ion energy for the first state exceeds the second ion energy threshold; and
provide an instruction to increase the power supplied to the plasma chamber upon determining that the ion energy is below the second ion energy threshold.

* * * * *